United States Patent
Hasegawa et al.

(10) Patent No.: US 7,339,828 B2
(45) Date of Patent: Mar. 4, 2008

(54) NONVOLATILE SEMICONDUCTOR MEMORY DEVICE WITH MEMORY CELLS, EACH HAVING AN FG CELL TRANSISTOR AND SELECT GATE TRANSISTOR, AND A METHOD OF WRITING DATA INTO THE SAME

(75) Inventors: Takehiro Hasegawa, Yokohama (JP); Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 11/248,303

(22) Filed: Oct. 13, 2005

(65) Prior Publication Data

US 2006/0083066 A1 Apr. 20, 2006

(30) Foreign Application Priority Data

Oct. 14, 2004 (JP) ............................ 2004-300386

(51) Int. Cl.
*G11C 11/34* (2006.01)
(52) U.S. Cl. ............................ 365/185.18; 365/185.27
(58) Field of Classification Search ........... 365/185.18, 365/185.17, 185.19, 185.27, 185.29
See application file for complete search history.

(56) References Cited

U.S. PATENT DOCUMENTS 5,923,585 A * 7/1999 Wong et al. ............ 365/185.03
6,961,268 B2 * 11/2005 Umezawa ............... 365/185.28
2004/0080981 A1 * 4/2004 Yoshida .................. 365/185.18

OTHER PUBLICATIONS

U.S. Appl. No. 11/244,287, filed Oct. 6, 2005, Shuto.
Ton Ditewig, et al. "An Embedded 1.2V-Read Flash Memory Module in a 0.18µm Logic Process"; 2001 IEEE International Solid-State Circuits Conference, Digest of Technical Papers; Feb. 5, 2001; pp. 34-35, 425.

* cited by examiner

*Primary Examiner*—Anh Phung
*Assistant Examiner*—Hien Nguyen
(74) *Attorney, Agent, or Firm*—Oblon, Spivak, McClelland, Maier & Neustadt, P.C.

(57) ABSTRACT

A semiconductor device comprises a memory cell array and a source line driver. Each of the memory cells in the memory cell array has a floating gate cell transistor which stores data by accumulating charge in the floating gate and a select gate transistor whose drain is connected to the source of the cell transistor and whose source is connected to a source line. The source line driver is configured so as to drive the source line in a write operation at a potential between the substrate bias potential of the cell transistor and select gate transistor and the ground potential.

19 Claims, 23 Drawing Sheets

FIG. 2

|  | Selected word line WL | Unselected word line WL |
|---|---|---|
| Selected bit line BL | Selected cell<br>BL -7V, CG 12V, SG -7V, Well -7V, SL Floating (about -5V) | Unselected cell<br>BL -7V, CG 0V, SG -7V, Well -7V, SL Floating (about -5V) |
| Unselected bit line BL | Unselected cell<br>BL 0V, CG 12V, SG -7V, Leakage current, Well -7V, SL Floating (about -5V) | Unselecedt cell<br>BL 0V, CG 0V, SG -7V, Leakage current, Well -7V, SL Floating (about -5V) |

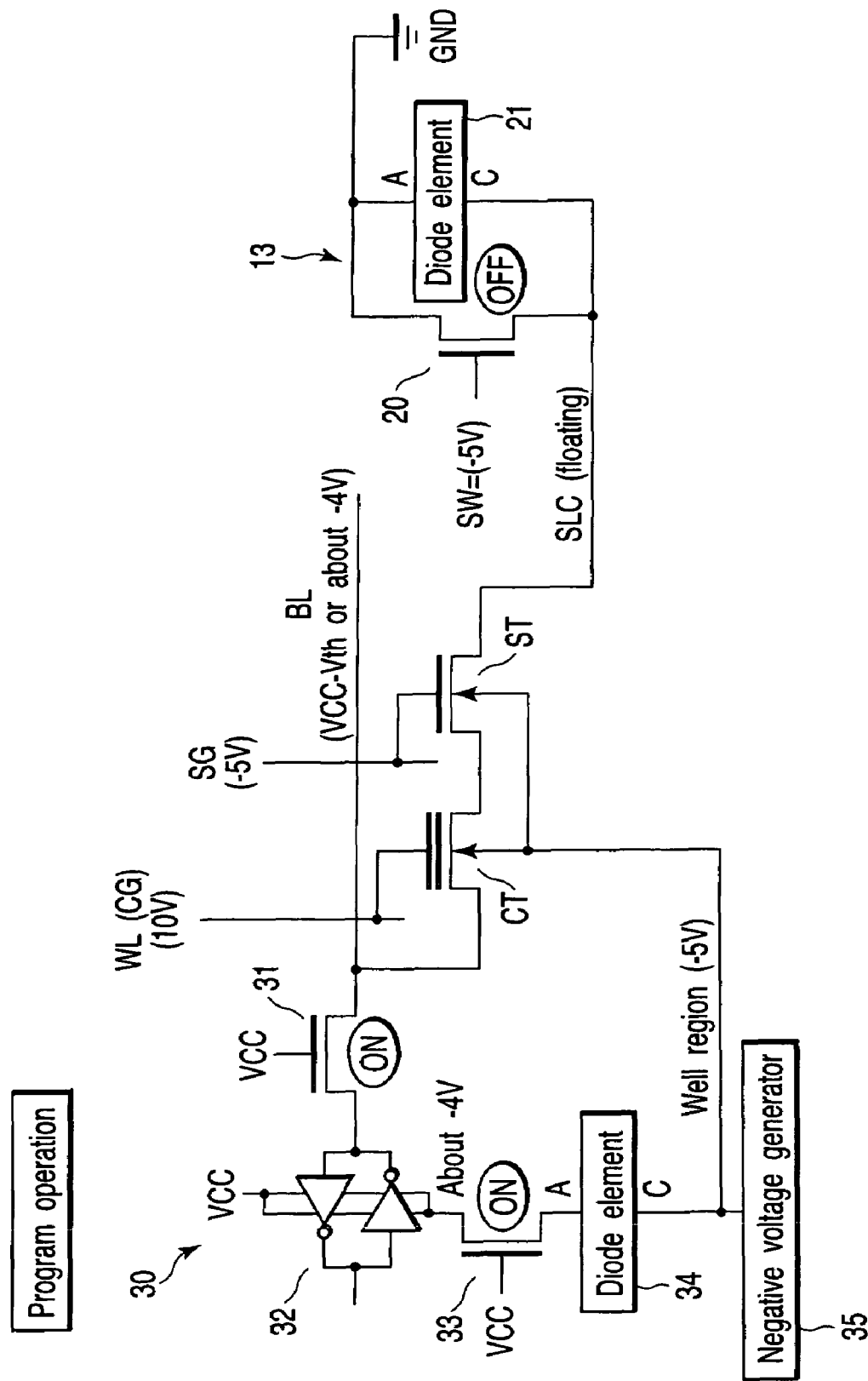
F I G. 24

NONVOLATILE SEMICONDUCTOR MEMORY DEVICE WITH MEMORY CELLS, EACH HAVING AN FG CELL TRANSISTOR AND SELECT GATE TRANSISTOR, AND A METHOD OF WRITING DATA INTO THE SAME

CROSS-REFERENCE TO RELATED APPLICATIONS

This application is based upon and claims the benefit of priority from prior Japanese Patent Application No. 2004-300386, filed Oct. 14, 2004, the entire contents of which are incorporated herein by reference.

BACKGROUND OF THE INVENTION

1. Field of the Invention

This invention relates to a semiconductor device and a method of writing data into the semiconductor device. More particularly, this invention relates to a nonvolatile semiconductor memory device with memory cells, each having, for example, an FG (floating gate) cell transistor and a select gate transistor connected to the source of the cell transistor, and a method of writing data into the nonvolatile semiconductor memory device.

2. Description of the Related Art

One known nonvolatile semiconductor memory device provided in a logic integrated circuit chip required to perform relatively high-speed reading is a flash memory as described in, for example, T. Ditewing, et al., "An Embedded 1.2 V-Read Flash Memory Module in a 0.18 μm Logic Process." 2001 IEEE International Solid-State Circuit Conference, DIGEST OF TECHNICAL PAPERS, 2.4, February, 2001, pp. 34-35. The nonvolatile semiconductor memory device includes memory cells each of which has an FG cell transistor that stores data by accumulating charge in the floating gate and a select gate transistor connected to the source of the cell transistor. The nonvolatile semiconductor memory device writes data into and erases data from a memory cell, using FN (Fowler-Nordheim) tunneling current. In an erase operation, a positive voltage is applied to the well region and a negative voltage is applied to the control gates, thereby erasing the memory cell array at a time. In a write operation, a positive voltage is applied to the selected control gate, a negative voltage is applied to the well region, a negative voltage is applied to the bit line of the memory cell to be written into (or the selected bit line), and 0 V is applied to the bit lines of the memory cells not to be written into (or the unselected bit lines).

The nonvolatile semiconductor memory device configured as described above has been required to have a larger capacity and a higher reading speed because of the tendency to higher integration. Therefore, nonvolatile semiconductor memory devices have been manufactured using techniques close to the limits of the manufacturing processes or processing accuracy. As a result, the characteristics of the memory cells do not have a sufficient margin, which can be the factors that cause erroneous operations, a decrease in the operating speed (for example, an increase in the erase time or a decrease in the writing speed), a variation in the distribution of the threshold voltages of the cell transistors, and erroneous writing.

BRIEF SUMMARY OF THE INVENTION

According to an aspect of the present invention, there is provided a semiconductor device comprising a floating gate cell transistor which stores data by accumulating charge in a floating gate, a select gate transistor whose drain is connected to the source of the cell transistor and whose source is connected to a source line, and a source line driver which is configured so as to drive the source line in a write operation at a potential between a substrate bias potential of the cell transistor and select gate transistor and the ground potential.

According to another aspect of the present invention, there is provided a semiconductor device comprising a memory cell array where memory cells are arranged in a matrix, each of the memory cells including a floating gate cell transistor that stores data by accumulating charge in the floating gate and a select gate transistor whose drain is connected to the source of the cell transistor, bit lines which are provided for columns of memory cells in the memory cell array in a one-to-one correspondence and which are connected to the drains of the cell transistors on a column basis, word lines which are provided for rows of memory cells in the memory cell array in a one-to-one correspondence and which are connected to the control gates of the cell transistors on a row basis, source lines which are provided in parallel with the word lines in a one-to-one correspondence and which are connected to the sources of the select gate transistors, and a source line driver which is configured so as to drive the source lines in a write operation at a potential between the substrate bias potential of the cell transistors and the select gate transistors and the ground potential.

According to still another aspect of the present invention, there is provided a method of writing data into a semiconductor device which includes a floating gate cell transistor that stores data by accumulating charge in a floating gate, a select gate transistor whose drain is connected to the source of the cell transistor and whose source is connected to a source line, and a source line driver which drives the source line, the method comprising setting the source line to the ground potential, changing the well region of the cell transistor and the select gate transistor from the ground potential to a negative potential, and disconnecting the source line from the ground potential in the middle of lowering the potential in the well region to a negative potential and lowering the source line potential to the negative potential through coupling with the well region.

BRIEF DESCRIPTION OF THE SEVERAL VIEWS OF THE DRAWING

FIG. 2 is a diagram which shows the relationship between potentials when a source line is brought into the floating state, the potentials being applied to the individual terminals of a memory cell in a write operation in the memory cell structure of FIG. 1, and which helps explain the process of consideration the inventors went through before reaching the present invention;

FIG. 24 is a circuit diagram to help explain a modification of the third embodiment;

DETAILED DESCRIPTION OF THE INVENTION

The process of consideration the inventors went through before reaching the present invention will be explained. Thereafter, referring to the accompanying drawings, embodiments of the present invention will be explained.

This invention has been made on the basis of the following consideration made by the inventors.

Figure 1:
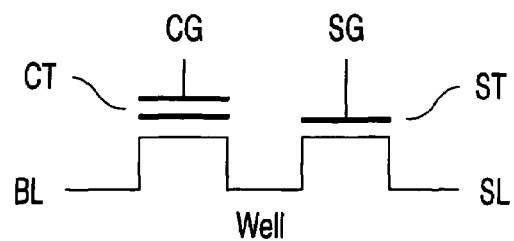
FIG. 1 is a circuit diagram of a memory cell to help explain the process of consideration the inventors went through before reaching the present invention.

As shown in FIG. 1, a memory cell composed of an FG cell transistor CT and a select gate transistor ST connected to the source of the cell transistor CT has the advantages of being capable of making the memory cell current larger and therefore making the reading speed faster than a memory structure that has a select gate transistor provided between a bit line and a cell transistor. The reason is that the drain of the cell transistor CT is connected directly to the bit line BL.

In a write operation, the potential applied to the unselected bit lines has to be shut off by only the source-side select gate transistors ST, thereby preventing current from flowing from the unselected bit lines to the source lines SL. Therefore, the select gate transistors ST must meet severe leakage-current requirements.

Figure 3:
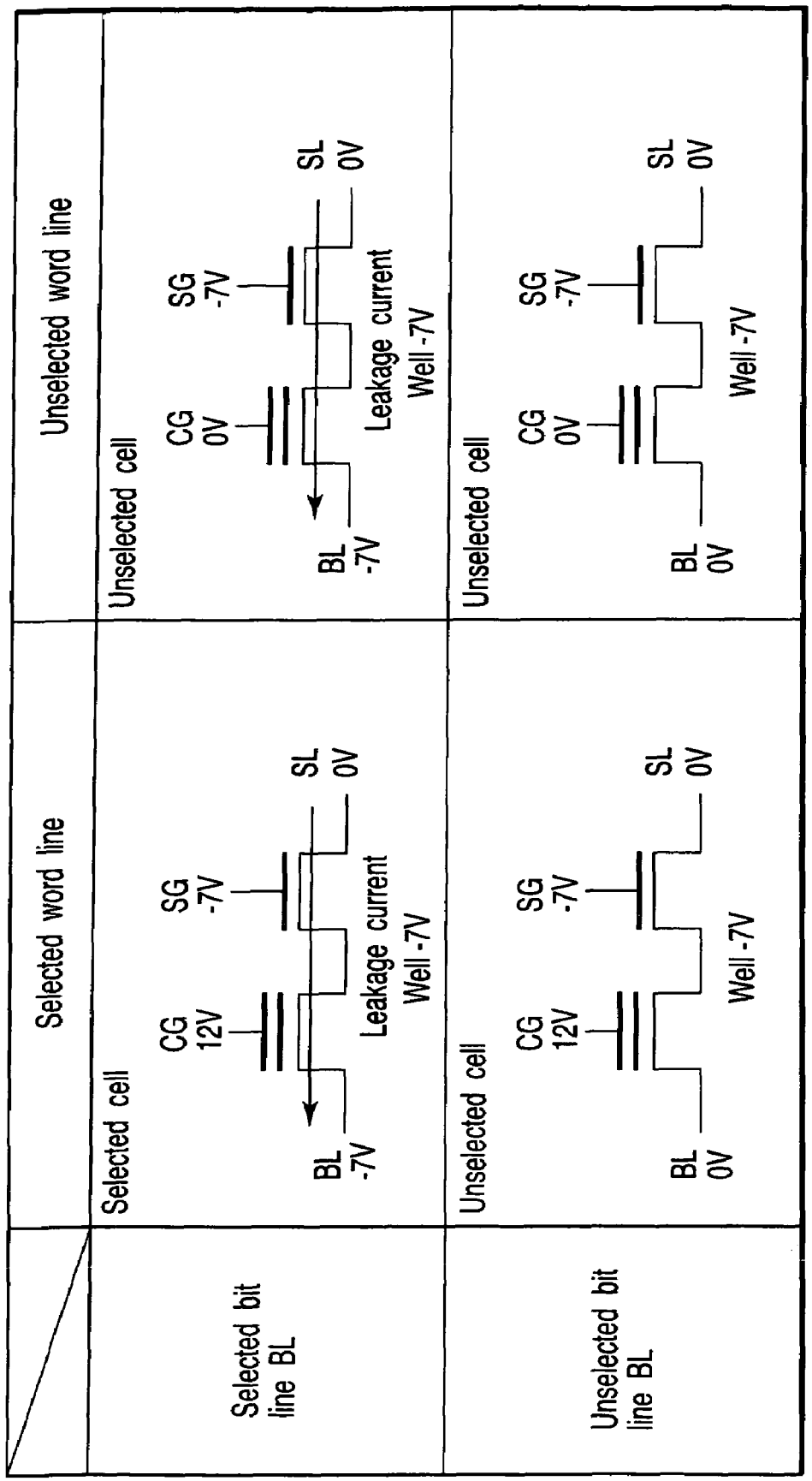
FIG. 3 is a diagram which shows the relationship between potentials when a source line is set to 0 V, the potentials being applied to the individual terminals of a memory cell in a write operation in the memory cell structure of FIG. 1, and which helps explain the process of consideration the inventors went through before reaching the present invention.

In the above-described memory cell configuration, the potential applied to each of the terminals of a memory cell in, for example, a write operation takes one of the following four states (1) to (4) as shown in FIGS. 2 and 3 according to the selected/unselected state of the word line and bit line.

(1) In a memory cell (or selected cell) connected to the selected word line and the selected bit line, 12 V is applied to the control gate CG, −7 V is applied to the select gate line SG, and −7 V is applied to the bit line BL. In this case, −7 V is applied to the well region.

(2) In the memory cells (or unselected cells) connected to the selected word line and the unselected bit lines, 12 V is applied to the control gate CG, −7 V is applied to the select gate SG, 0 V is applied to the bit line BL, and −7 V is applied to the well region.

(3) In the memory cells (or unselected cells) connected to the unselected word lines and the selected bit line, 0 V is applied to the control gate CG, −7 V is applied to the select gate SG, −7 V is applied to the bit line BL, and −7 V is applied to the well region.

(4) In the memory cells (or unselected cells) connected to the unselected word lines and the unselected bit lines, 0 V is applied to the control gate CG, −7 V is applied to the select gate SG, 0 V is applied to the bit line BL, and −7 V is applied to the well region.

At this time, the source line SL is set in the floating state as shown in FIG. 2 or to 0 V as shown in FIG. 3. Since the source line SL is connected equally to the individual memory cells in the memory cell array, the same voltage is applied to all of the memory cells.

When writing is done by applying potentials to the individual terminals of a memory cell so as to meet the relationship shown in item (1) to item (4), the following problems will possibly arise.

When the source line SL is in the floating state, it is conceivable from simulation or the like that a voltage of about −5 V is applied to the source line SL. In this case, the select gate transistor ST can undergo punching through, permitting leakage current to flow between the bit line BL and the source line SL. It is because a voltage of about 5 V is applied between the bit line BL and source line SL in a memory cell to which the voltages have been applied in item (2), and then on top of that, the cell transistor CT has been completely turned on by a voltage of 12 V applied to the control gate CG. In a memory cell to which the voltages have been applied in item (4), since the voltage applied to the control gate CG is lower, leakage current will possibly flow between the bit line BL and source line SL as in the memory cell in item (2) (see FIG. 2), although the amount of leakage current is smaller than in the memory cell in item (2).

Figure 4:
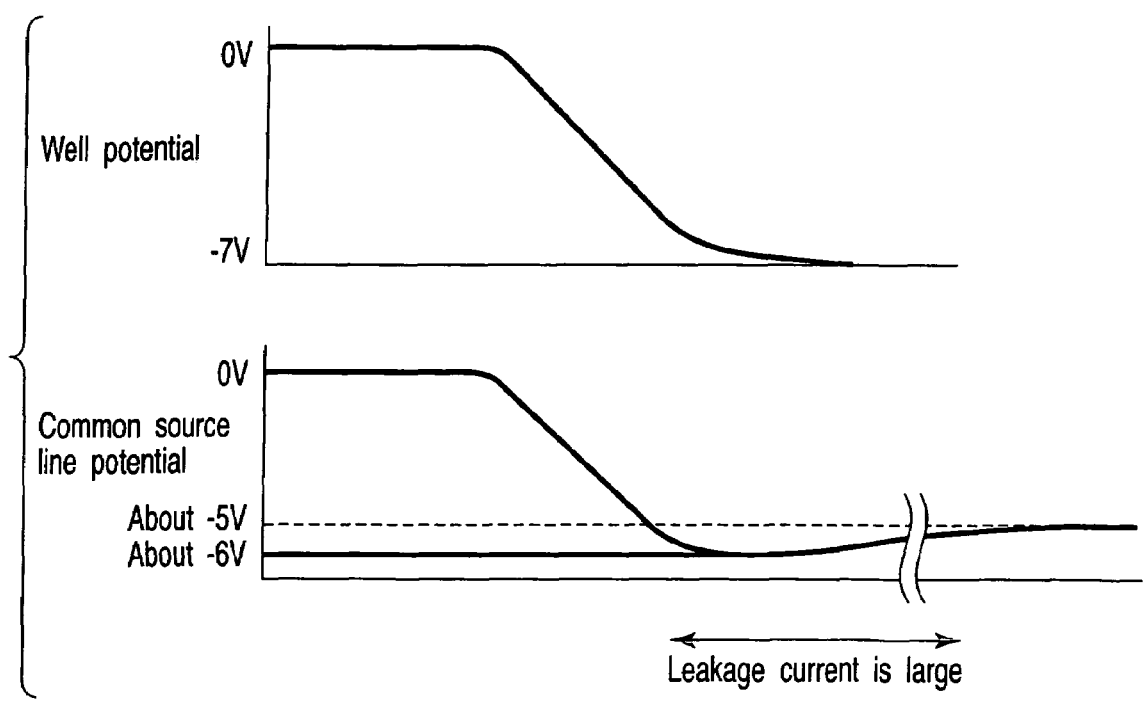
FIG. 4 is a timing chart to help explain a change in the common source line potential as a result of a drop in the well potential.

In addition, a drop in the well potential causes the source most of whose capacity is connected to the well region to drop temporarily below about −5 V by coupling. At this time, a leakage current larger than the above current will be generated between the unselected bit lines and the source (see FIG. 4).

Furthermore, when the source line SL is at 0 V, since a voltage of 7 V is applied between the bit line BL and source line SL of a memory cell to which the voltages have been applied in item (1), and then on top of that, the cell transistor CT has been completely turned on by a voltage of 12 V applied to the control gate CG, the select gate transistor ST can undergo punching through and leakage current will possibly flow between the source line SL and bit line BL. In a memory cell to which the voltages have been applied in item (3), since the voltage applied to the control gate CG is lower, leakage current will possibly flow between the source line SL and bit line BL as in the memory cell in item (1) (see FIG. 3), although the amount of leakage current is smaller than in the memory cell in item (1).

As described above, even when either the floating state or 0 V is selected as the potential for the source line, there is a possibility that leakage current will occur between the bit line BL and the source line in a write operation. If the leakage current has exceeded the amount of current supplied from the negative potential generator, it is impossible to generate a normal negative potential, with the result that a fault will occur (or erroneous writing is done) in a write operation. Even when the leakage current is not so large that it exceeds the amount of current supplied from the negative potential generator, the occurrence of the leakage current changes the channel potential of the cell transistor, with the result that the writing speed is slowed or erroneous writing is done.

Such problems can be alleviated a little by lowering the operating voltages, or for example, by applying 10 V to the control gate CG, −5 V to the select gate line SG, −5 V to the bit line BL, and −5 V to the well region. However, this approach does not essentially solve the problems.

Moreover, for another reason, the occurrence of the leakage current can lead to an erroneous operation or to a decrease in the operating speed. A detailed explanation will be given using a nonvolatile semiconductor memory device whose operating speed has been lowered as an example.

Figure 5:
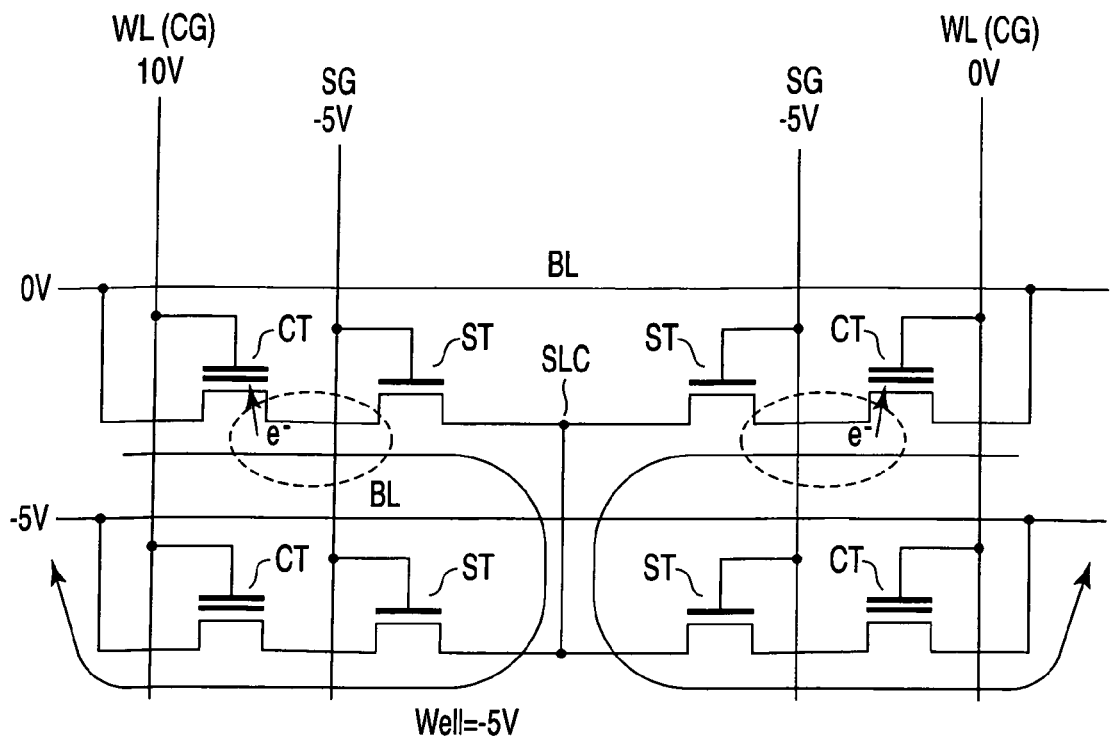
FIG. 5 is a circuit diagram of a leakage current path when a source line is brought into the floating state, which helps explain the process of consideration the inventors went through before reaching the present invention.
Figure 6:
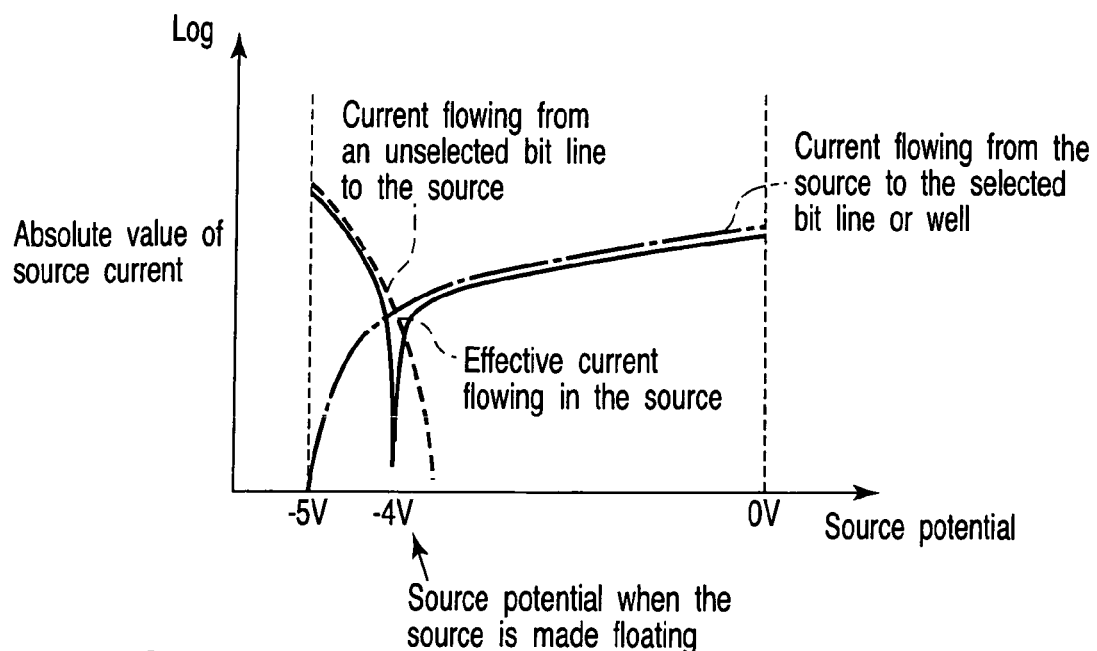
FIG. 6 is a characteristic diagram which shows the relationship between the source potential of a cell transistor and the absolute value of the source current and which helps explain the process of consideration the inventors went through before reaching the present invention.

As shown in FIG. 5, the source of each of the cell transistors CT is connected equally to the source line SL via the drain and source of the select gate transistor ST and is brought into the floating state. As a result, leakage current flows through a path shown by a solid line in FIG. 5, with the result that the source potential of the cell transistor CT is such that a leakage current from the unselected bit line to the source is equal to a leakage current from the source to the selected bit line as shown in FIG. 6.

When the source potential is high, the substrate bias is applied effectively to the select gate transistor ST of the memory cell connected to the unselected bit line, resulting in a smaller leakage current. In contrast, since the substrate bias is not applied to the select gate transistor ST of the memory cell connected to the selected bit line, the leakage current is larger. Therefore, the source potential of the cell transistor CT settles not at the midpoint between 0 V and a negative potential (−5 V in FIG. 6), but at a potential lower than the negative potential (e.g., −4 V).

At this time, the following problem can happen. Specifically, a voltage of −4 V is applied between the source and drain of the select gate transistor ST of a memory cell connected to an unselected bit line, with the result that a strong electric field is generated at the node (enclosed by a broken line in FIG. 5) on the cell transistor CT side. Consequently, even a very small leakage current at the select gate transistor ST generates hot carriers, a part of the hot carriers being taken into the floating gate of the cell transistor CT, which might permit data to be written erroneously into a memory cell supposed not to be written into. This phenomenon becomes more distinct when the applied negative voltage is lowered to increase a margin for the threshold voltage distribution of a "1" cell and a "0" cell. Thus, the phenomenon is a factor that hinders the increase of the margin of the threshold voltage distribution of the cell transistor CT.

As described above, the source potential is such that the current flowing from an unselected bit line to the source line balances with the current flowing from the source to the selected bit line or to the substrate. At this time, since most of the current flowing from the source is the off leakage current of the select gate transistor ST flowing into the selected bit line, all the current flowing to the negative voltage is equivalent to the off leakage current of the select gate transistor ST. At this time, it is desirable for the following reasons that the off leakage current should be suppressed.

A first reason is that lowering the negative voltage becomes difficult. A second reason is that the current flowing from the source to the selected bit line becomes larger and therefore the cell transistor connected to an unselected bit line can be written into erroneously by hot carriers.

The first reason will be explained in detail. The negative voltage generator in the chip generates a substrate potential for the selected bit line and select gate transistor. If the leakage current is large, the leakage current becomes larger than the driving capability of the negative voltage generator, the negative voltage becomes higher. Therefore, since the negative voltage cannot be output sufficiently, the margin of the threshold voltage Vth of the selected cell to be written into and the margin of the unselected cells supposed not to be written into are degraded.

Next, the second reason will be explained in detail. The current flowing from the source to the selected bit line is almost equal to the current flowing from an unselected bit line to the source. Therefore, as the current flowing from the source to the selected bit line becomes larger, the current flowing from the unselected bit line to the source also becomes larger (because the balanced source potential shifts). The leakage current flowing from the unselected bit line generates hot carriers, which leads to the possibility that the memory cells connected to the unselected bit lines will be written into erroneously.

In addition, since the source potential drops through coupling when the well potential drops, the source potential is lowered temporarily below the source potential at which the current flowing from the source to the selected bit line balances with the current flowing from the unselected bit line to the source. At that time, the leakage current flowing from the unselected bit line becomes larger, which generates hot carriers, which makes higher the possibility that the memory cells connected to the unselected bit lines will be written into erroneously.

To solve these problems, a method of suppressing the off leakage current by raising the threshold voltage of the select gate transistor can be considered. In that case, the on current in the select gate transistor is also decreased in a read operation, which lowers the reading speed. In addition, when the channel ion implantation in the select gate transistor and the channel ion implantation in the cell transistor are made common to manufacturing processes, the neutral threshold voltage of the cell transistor is also raised, deteriorating the erase characteristic (or making the erasing time longer), which is undesirable.

Next, on the basis of the above considerations, embodiments of the present invention which are capable of solving various problems recognized by the inventors will be explained using the accompanying drawings.

First Embodiment

Figure 7:
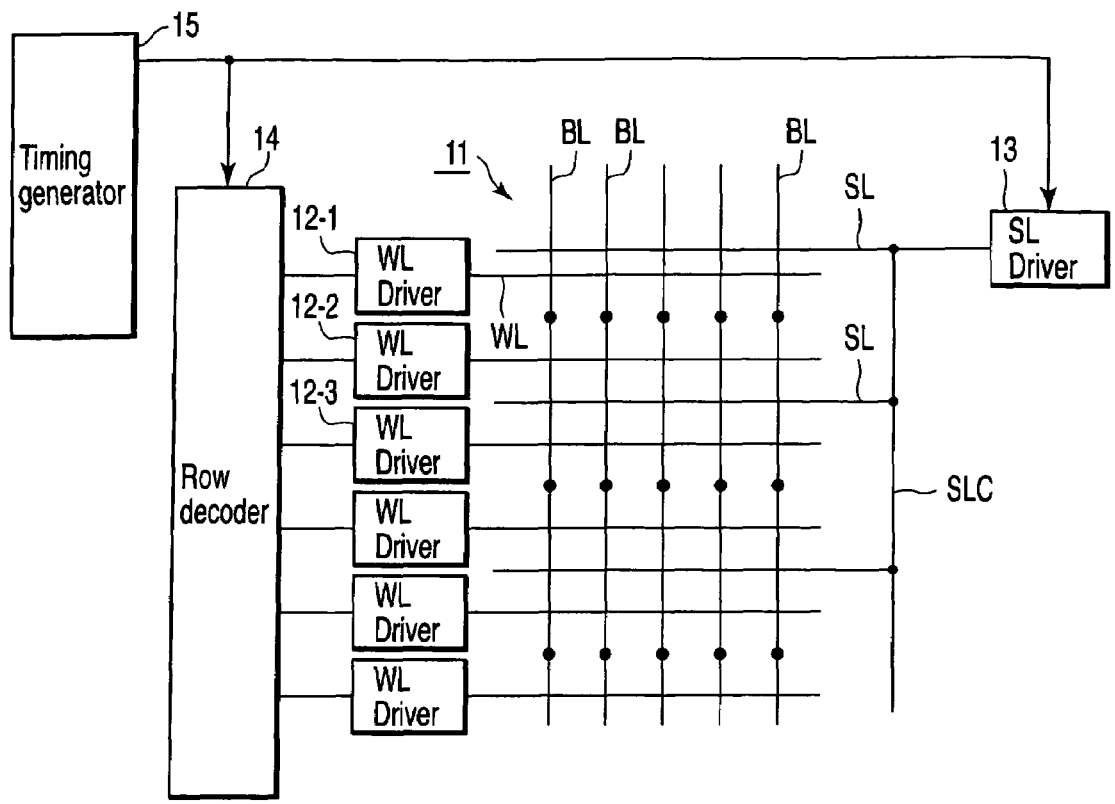
FIG. 7 is a block diagram schematically showing the configuration of a nonvolatile semiconductor memory device according to a first embodiment of the present invention.
Figure 8:
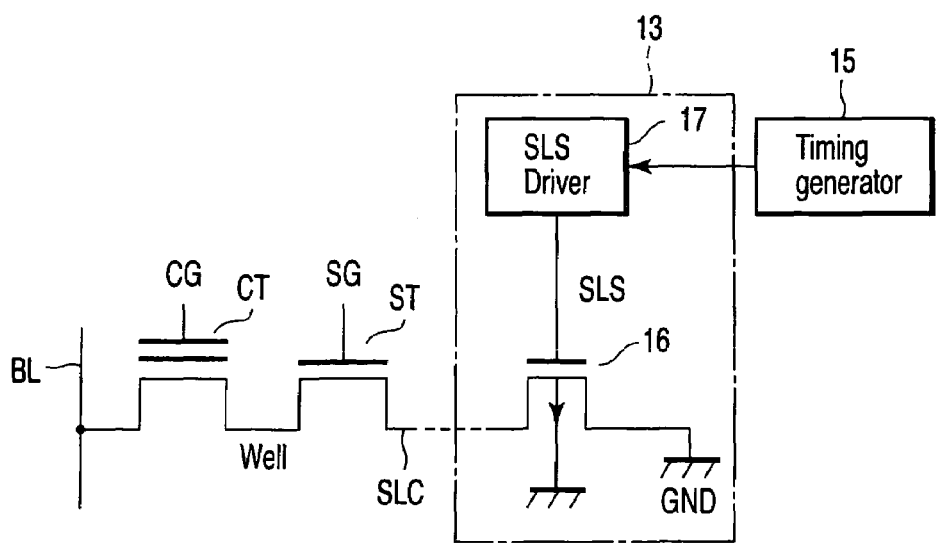
FIG. 8 is a circuit diagram which shows an example of the configuration of a source line driver, extracting a main part from the circuit of FIG. 7.

FIG. 7 is a block diagram schematically showing the configuration of a nonvolatile semiconductor memory device according to a first embodiment of the present invention. FIG. 8 is a circuit diagram which shows an example of the configuration of a source line driver, extracting a main part from the circuit of FIG. 7.

In a memory cell array 11, memory cells are arranged in a matrix. Each of the memory cells, which has a memory cell configuration as shown in FIG. 1, includes, for example, an FG cell transistor and a select gate transistor connected to the source of the cell transistor. The cell transistor has its control gate connected to a word line WL and its drain connected to a bit line BL provided in a direction in which it crosses the word line WL. The drain of the select gate transistor is connected to the source of each of the cell transistors. A select gate line (not shown) is connected to the gate of the each of the cell transistors. The source of each of the select gate transistors is connected equally to a source line SL provided in the same direction as the word line WL.

The word lines WL are selectively driven by word line drivers (WL drivers) 12-1, 12-2, 12-3, . . . . The source lines SL are connected to a common source line SLC. The source lines SL are driven by a source line driver (SL driver) 13 via the common source line SLC. A row decoder 14 supplies a decode signal to the word line drivers 12-1, 12-2, 13-3, . . . . The operation timing of the source line driver 13 and row decoder 14 is controlled by a timing generator 15.

The source line driver 13 includes a p-channel MOSFET 16 which acts as a switch element for switching the common source line SCL from the grounded state to the floating state and a driver circuit (SLS driver) 17 for the p-channel MOSFET 16. The MOSFET 16 has its drain connected to the common source line and its source and back gate (or well region) connected to the ground point GND. Input to the driver circuit 17 is a signal (timing signal) which controls the timing with which the potentials necessary to write data into the well region, the control gate CG (or word line WL), or the like are switched. On the basis of the timing signal, the driver circuit 17 performs on/off control of the MOSFET 16 in such a manner that the MOSFET 16 is changed from on to off a little later than the potential in the well region begins to drop from 0 V, which changes the source line SL from the ground state to the floating state.

With the above configuration, use of the source line driver in a write operation prevents the source potential from dropping unnecessarily, which enables leakage current to be suppressed.

In the first embodiment, changing the writing procedure as described below prevents the source line SL from dropping below the potential at which the leakage current flowing from the source to the selected bit line balances with the leakage current flowing from an unselected bit line to the source.

That is, to prevent the source line SL from dropping unnecessary, writing is done in the following procedure.

Figure 9A:
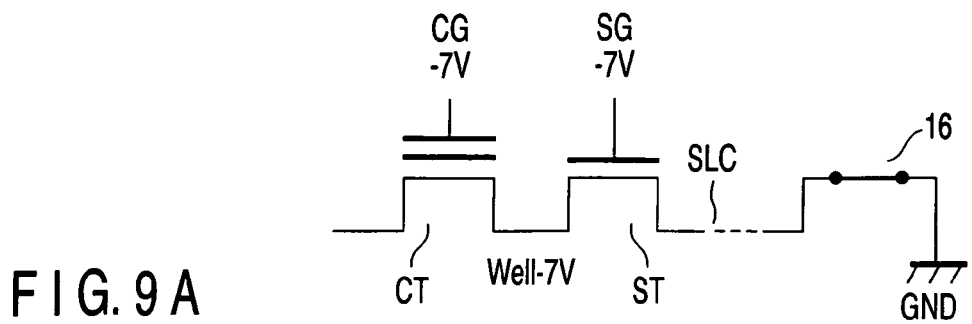
FIG. 9A is an equivalent circuit diagram in a first step of a write operation to help explain a write operation in the circuit shown in FIGS. 7 and 8.

First, the MOSFET 16 is turned on so as to give an equivalent representation using a switch in FIG. 9A, connecting the source line SL to the ground point GND. Thereafter, as shown in FIG. 9C, the potential of the well region (back gate) of the cell transistor CT and that of the select gate transistor ST are lowered from 0 V to −7 V (STEP 1). At this time, the common source line SLC is kept at 0 V.

Figure 9B:
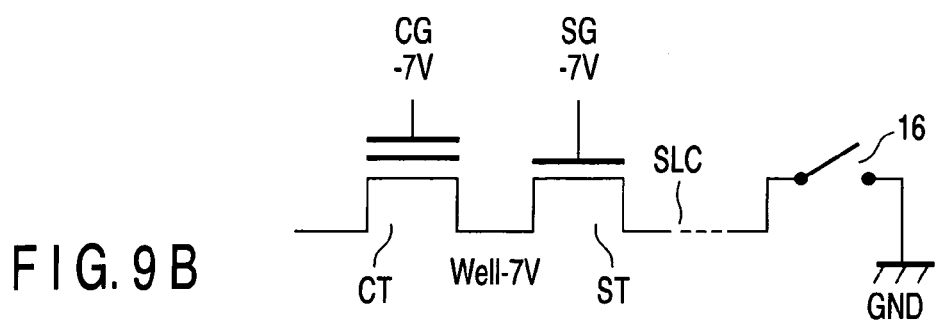
FIG. 9B is an equivalent circuit diagram in a second step of a write operation to help explain a write operation in the circuit shown in FIGS. 7 and 8.
Figure 9C:
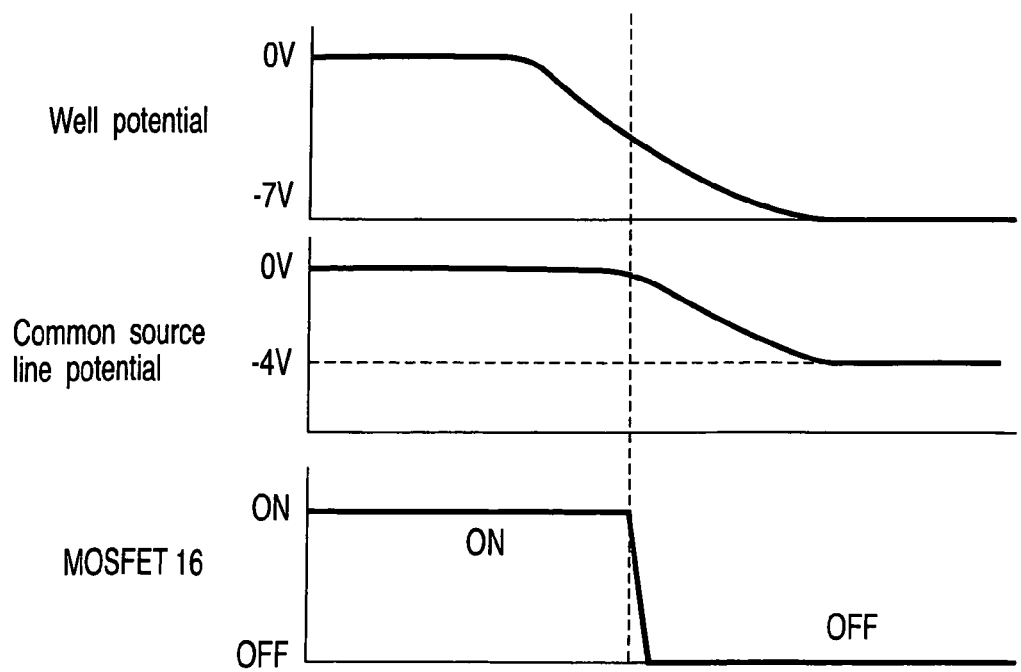
FIG. 9C is a timing chart which shows the relationship between the well potential and common source line potential and the switching operation of a MOSFET in a write operation and which helps explain a write operation in the circuit shown in FIGS. 7 and 8.

In the course of dropping the potential of the well region to −7 V, the MOSFET 16 is turned off as shown in FIG. 9B, thereby disconnecting the source line SL from the ground point GND (STEP 2).

After the source line SL is disconnected from the ground point GND, the potential of the source line SL drops toward a negative potential through coupling with the well region as shown in FIG. 9C (STEP 3).

Then, finally, when the well region has reached −7 V, the common source line SLC has a potential between 0 V and −7 V (STEP 4).

Figure 10:
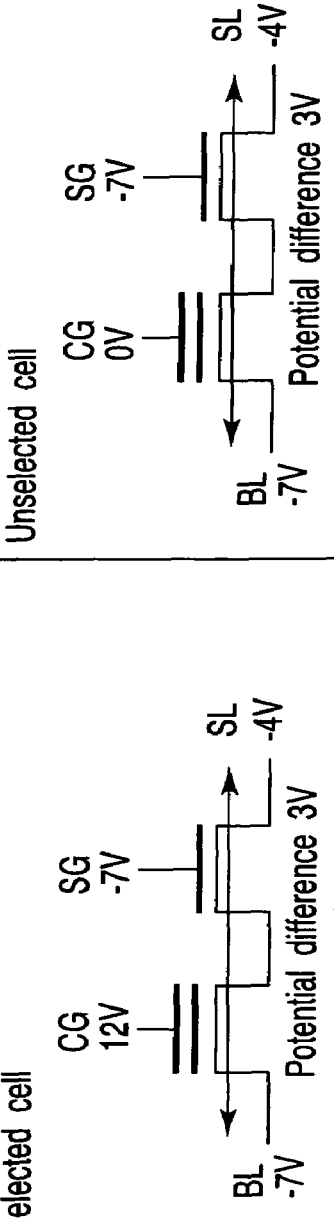
FIG. 10 is a diagram showing the voltage applied state of the individual terminals of a memory cell immediately after the voltage of the well region is dropped to −7 V in the circuit shown in FIGS. 7 and 8.

FIG. 10 is a diagram showing the voltage applied state of the individual terminals of a memory cell immediately after the voltage of the well region is dropped to −7 V in the circuits shown in FIGS. 7 and 8. As shown in FIG. 10, in any one of the selected cell and unselected cells, the potential difference between the bit line BL and source line SL can be suppressed to about 3 V to 4 V. This enables an excessive leakage current flowing between the bit line and source line SL to be suppressed.

Therefore, with the above configuration and the writing method, the margin of the memory characteristic can be widened and erroneous operations and a decrease in the operating speed can be suppressed.

[Modification 1]

Figure 11:
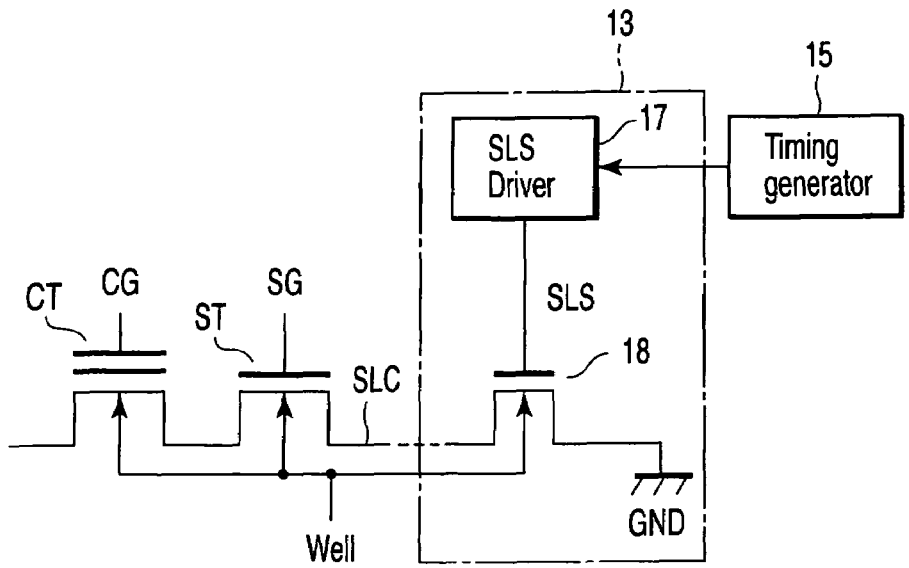
FIG. 11 is a circuit diagram which shows another example of the configuration of the source line driver, extracting a main part from the circuit of FIG. 7.

FIG. 11 shows another example of the configuration of the source line driver 13. In this configuration, an n-channel MOSFET 18 and a driver circuit 17 realizes a similar operation. This configuration differs from the above configuration using the p-channel MOSFET 16 in that the cell transistor CT and select transistor ST share the potential of the well region (back gate) of the n-channel MOSFET 18. The remaining configuration is the same as that of the circuit shown in FIG. 8.

Figure 12:
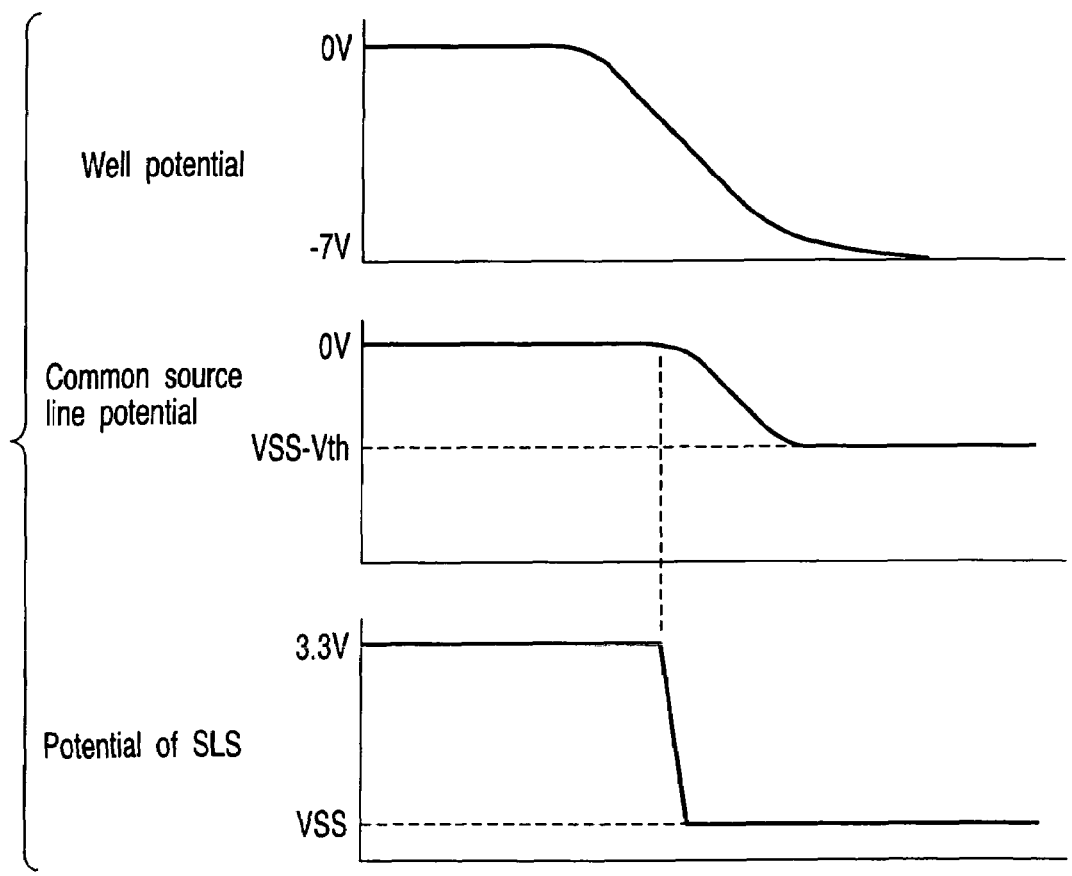
FIG. 12 is a timing chart to help explain a write operation in the circuit of FIG. 11.

In this configuration, for example, operations according to a timing chart as shown in FIG. 12 are carried out. Specifically, when the output potential SLS of the driver circuit 17 is dropped to VSS, the n-channel MOSFET 18 is turned off temporarily and its source potential drops by a leakage current or coupling. When the source potential has dropped to the potential lower than VSS by the threshold voltage of the n-channel MOSFET 18, the MOSFET 18 goes on, with the result that the dropping of the source potential stops there. For example, when VSS is set to 0 V, the source is at a potential of about −3 V at which the current flowing from the source to the selected bit line balances with the current flowing from the ground point GND via the MOSFET 18.

While the timing with which the MOSFET 16 is turned off is delayed in FIG. 11, this configuration does not require the source potential to be dropped unnecessarily because of use of the MOSFET 18, which makes the MOSFET 16 effective without delaying the timing. Since it is desirable that the source potential should be at a potential closer to the midpoint between 0 V to −7 V and therefore it is desirable that VSS should be equal to or lower than 0 V.

Even with such a configuration and a writing method, the margin of the memory cell characteristics can be made wider and erroneous operations and a drop in the operating speed can suppressed.

[Modification 2]

The first embodiment and first modification are based on the assumption that the common source line SLC is common to the whole of the memory cell array. Therefore, only one source line driver has been provided for the common source line SLC.

However, for example, when the driving capability of the source line driver, or when the resistance or capacity of the source line is large, the memory cell array may be divided into a plurality of sub-arrays and a plurality of source line drives operating in the same manner may be provided for the sub-arrays in a one-to-one correspondence.

With this configuration, the source line potential can be equalized over the entire memory cell array.

In addition, the source line potential can be set to a potential between 0 V and −7 V at which a leakage current becomes the smallest.

Second Embodiment

Figure 13:
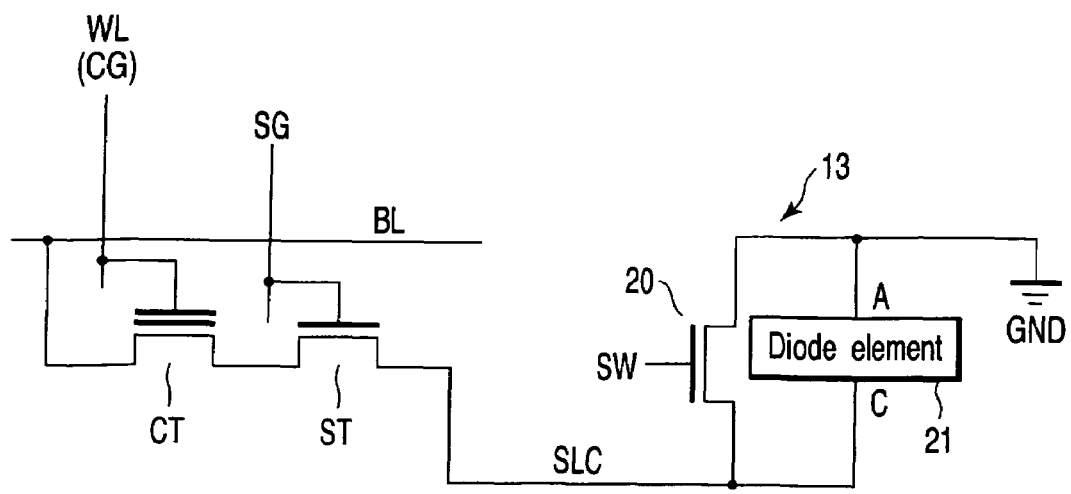
FIG. 13 is a circuit diagram which helps explain a nonvolatile semiconductor memory device according to a second embodiment of the present invention and a method of writing data into the nonvolatile semiconductor memory device and which shows an example of the configuration of a source line driver, extracting a main part from the circuit of FIG. 7.

FIG. 13 is a circuit diagram which helps explain a nonvolatile semiconductor memory device according to a second embodiment of the present invention and a method of writing data into the nonvolatile semiconductor memory device and which shows an example of the configuration of a source line driver, extracting a main part from the circuit of FIG. 7. FIGS. 14A to 14F each show an example of the configuration of a diode element in the circuit of FIG. 13.

As shown in FIG. 13, a cell transistor CT has its control gate CG connected to a word line WL and its drain connected to a bit line BL provided in a direction in which it crosses the word line WL. The drain of a select gate transistor ST is connected to the source of each of the cell transistors CT. A select gate line SG is connected to the gate of the select gate transistor ST. The source of each of the select gate transistors is connected equally to a common source line SLC.

A source line driver 13 is connected to the common source line SLC. The source line driver 13 includes a switching transistor (n-channel MOSFET) 20 and a diode element 21. The source of the switching transistor is connected to the common source line SLC. The drain of the switching transistor is connected to the ground point GND acting as a source potential in a read operation. A timing signal acting as a switching signal SW is supplied from a timing generator 15 to the gate of the switching transistor 20. The diode element 21 is connected in parallel with the switching transistor 20. The diode element 21 has its anode connected to the ground point GND acting as the source potential in a read operation and its cathode connected to the source of the MOSFET 20.

Figure 14A:
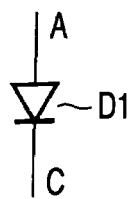
FIGS. 14A to 14F are circuit diagrams which show a first to a sixth example of the configuration of a diode element in the circuit of FIG. 13, respectively.
Figure 14B:
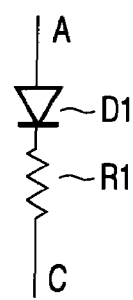
Figure 14C:
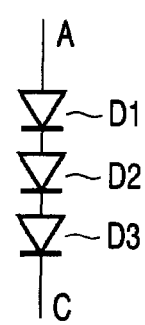
Figure 14D:
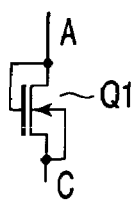
Figure 14E:
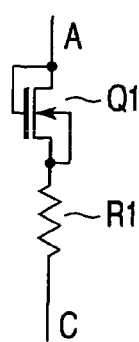
Figure 14F:
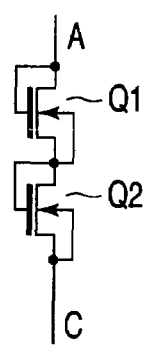

Various configurations may be applied to the diode element 21, provided that the element allows current to flow in the forward direction and prevents current from flowing in the reverse direction. For instance, the following configurations may be applied: a p-n junction diode D1 as shown in FIG. 14A, a series connection circuit of a p-n junction diode D1 and a resistance R1 as shown in FIG. 14B, a series connection circuit of p-n junction diodes D1, D2, D3 as shown in FIG. 14C, a diode-connection MOSFET Q1 as shown in FIG. 14D, a series connection circuit of a diode-connection MOSFET Q1 and a resistance R1 as shown in FIG. 14E, and a series connection circuit of diode-connection MOSFET Q1 and MOSFET Q2 as shown in FIG. 14F. The diode element 21 may have another configuration, provided that the necessary characteristic for setting the source potential is obtained.

Figure 15:
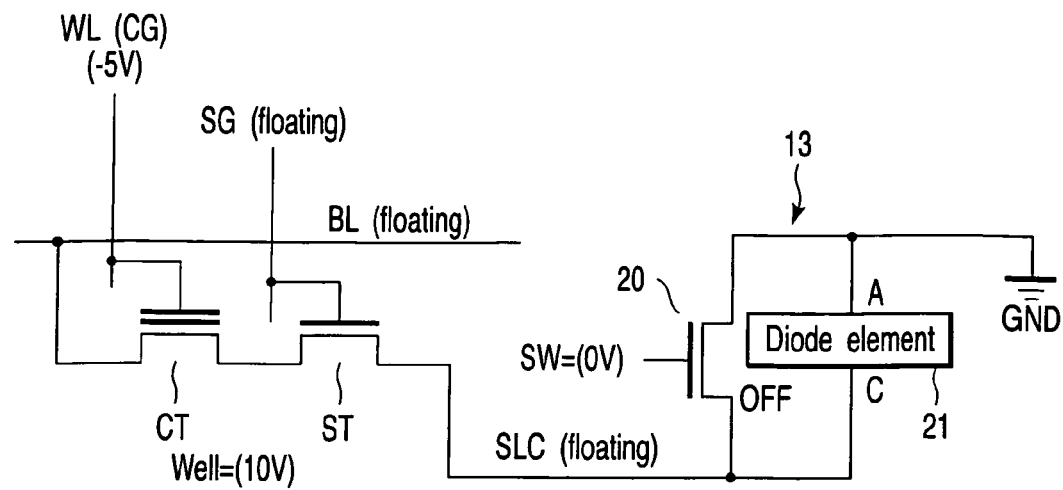
FIG. 15 is a circuit diagram to help explain an erase operation in the circuit of FIG. 13.

The operation of the above configuration will be explained. As shown in FIG. 15, in an erase operation, 10 V is applied to the well region and −5 V is applied to the control gate CG (word line WL), thereby extracting electrons in the floating gate of the cell transistor CT into the substrate. At this time, the switching signal is set at 0 V, turning off the switching transistor 20. In this case, the diode element 21 is reverse-biased, preventing current from flowing.

Figure 16:
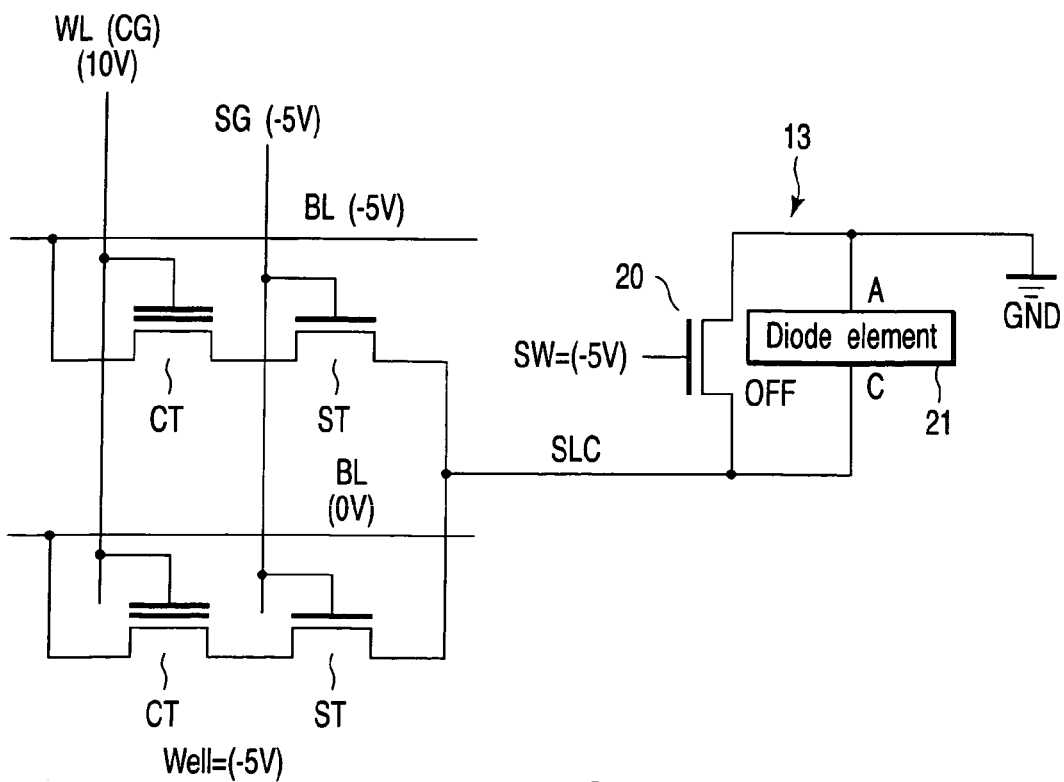
FIG. 16 is a circuit diagram to help explain a write (program) operation in the circuit of FIG. 13.
Figure 17:
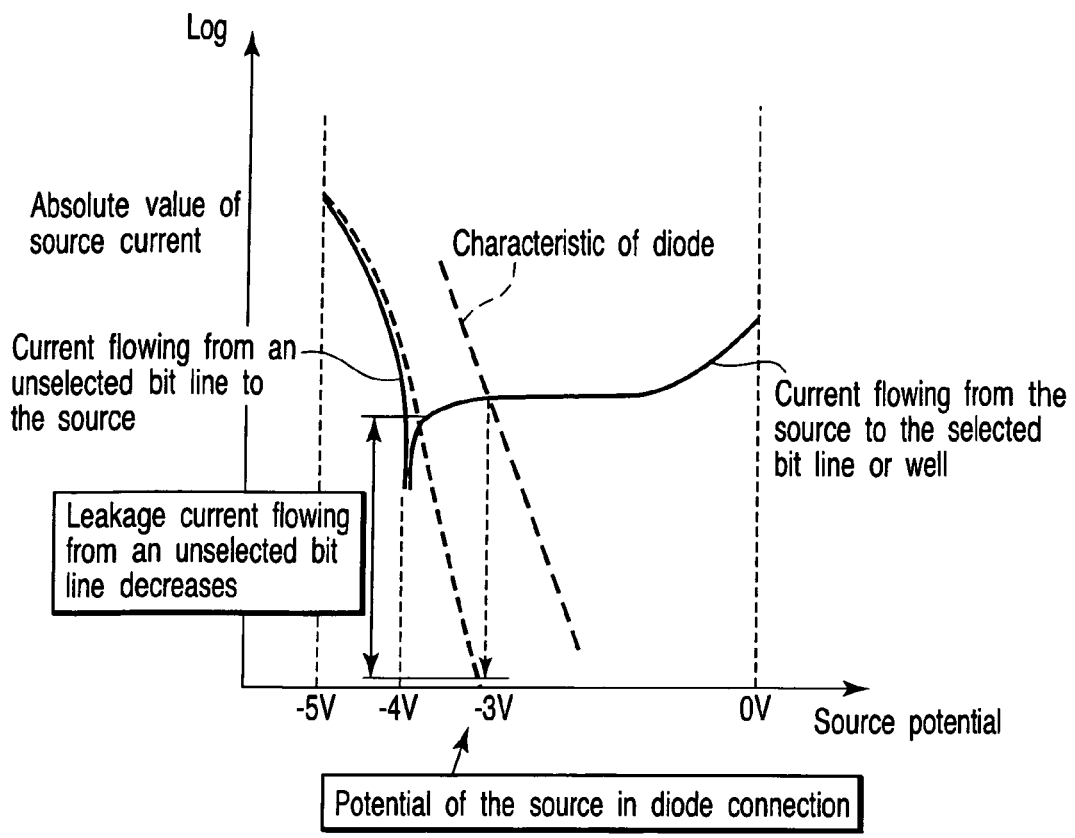
FIG. 17 is a characteristic diagram showing the relationship between the source potential of a cell transistor and the absolute value of the source current at the time of programming in the circuit of FIG. 13.

On the other hand, as shown in FIG. 16, in a write operation (or a program operation), 10 V is applied to the control gate CG (word line WL), −5 V is applied to the well region, −5 V is applied to the select gate line SG, −5 V is applied to a bit line BL to be written into, and 0 V is applied to a bit line not to be written into. At this time, the switching signal SW is set to −5 V, turning off the switching transistor 20. In this case, as shown in FIG. 17, the presence of the diode element 21 enables the potential of the common source line SLC to have a value (−3 V in this example) at which the current following the current characteristic of the diode element 21 balances with the current following the leakage characteristic of the original cell transistor CT.

Accordingly, with this configuration, since the leakage current flowing from the unselected bit lines can be reduced, deterioration by hot carriers caused by the leakage current is decreased and therefore erroneous writing can be suppressed.

Figure 18:
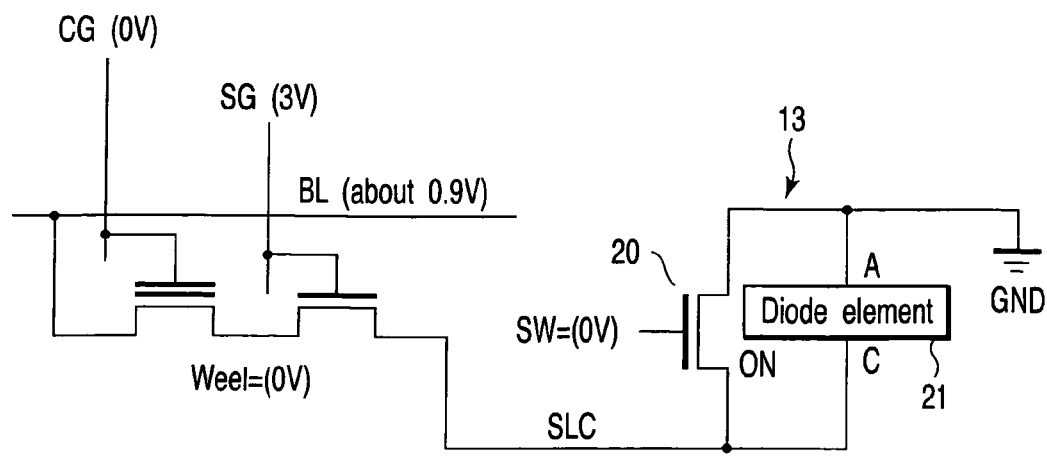
FIG. 18 is a circuit diagram to help explain a read operation in the circuit of FIG. 13.

In addition, as shown in FIG. 18, in a read operation, 0 V is applied to the control gate CG (word line WL), 3 V is applied to the select gate line SG, about 0.9 V is applied to the bit line BL, and the switching signal SW is set at 0 V, thereby turning on the switching transistor 20. At this time, whether data is "1" or "0" is determined, depending on whether the value of the current flowing from the bit line BL to the common source line SLC is small or large.

At this time, since the anode of the diode element 21 is connected to the same potential as that of the source potential (here, 0 V) in a read operation, the potential difference between both ends of the diode element 21 is 0 V, with the result that no current flows. Therefore, the diode element 21 has no effect on the read operation. The reason is that the anode of the diode element 21 is connected to the same potential as that in a read operation. If the anode of the diode element 21 is connected to another potential (e.g., VCC), a switching element has to be inserted between the diode element 21 and the common source line SLC, thereby turning off the diode element 21 in a read operation.

While in the second embodiment, a source potential of −3 V in a program operation has been used as an example, the source potential is not limited to −3 V and may be set to any potential, provided that erroneous writing is not done.

To make the operation of the nonvolatile semiconductor memory device stable, it is desirable to make larger the difference between the threshold voltage of the cell transistor in an erase operation and the threshold voltage of the cell transistor in a write operation. To do this, it is desirable that the negative voltage should be lowered. However, at this time, the potential difference between the selected bit line and an unselected bit line becomes larger, which makes erroneous writing more liable to occur.

However, in the nonvolatile semiconductor memory device of the second embodiment, even when the negative voltage is lowered, the source potential can be set to a certain level, enabling erroneous writing to be avoided, which produces a great effect. Of course, the source potential can be set to a fixed potential by using the output of a power supply generator. In that case, a power supply generator is needed, which increases not only the pattern occupying area but also the power consumption.

Third Embodiment

Figure 19:
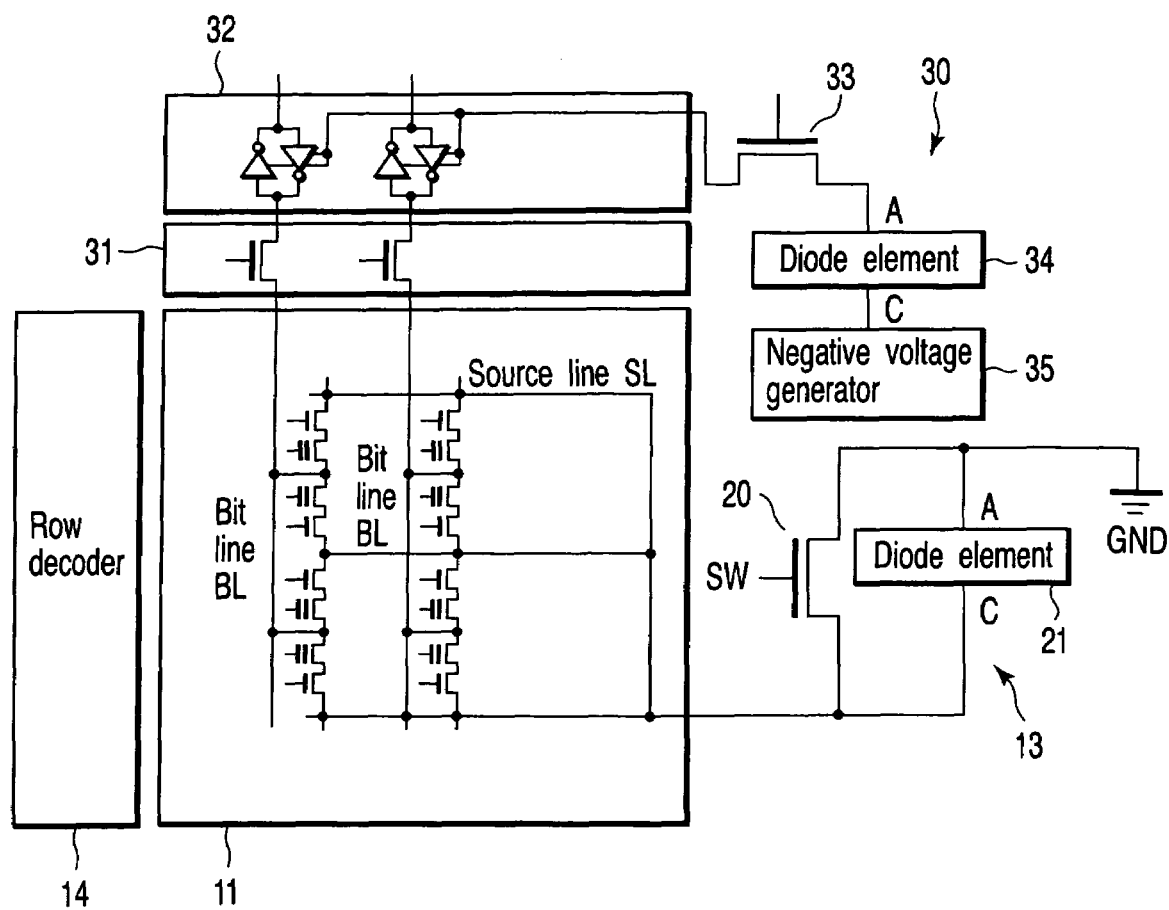
FIG. 19 is a block diagram which helps explain a nonvolatile semiconductor memory device according to a third embodiment of the present invention and a method of writing data into the nonvolatile semiconductor memory device and which shows a schematic configuration.
Figure 20:
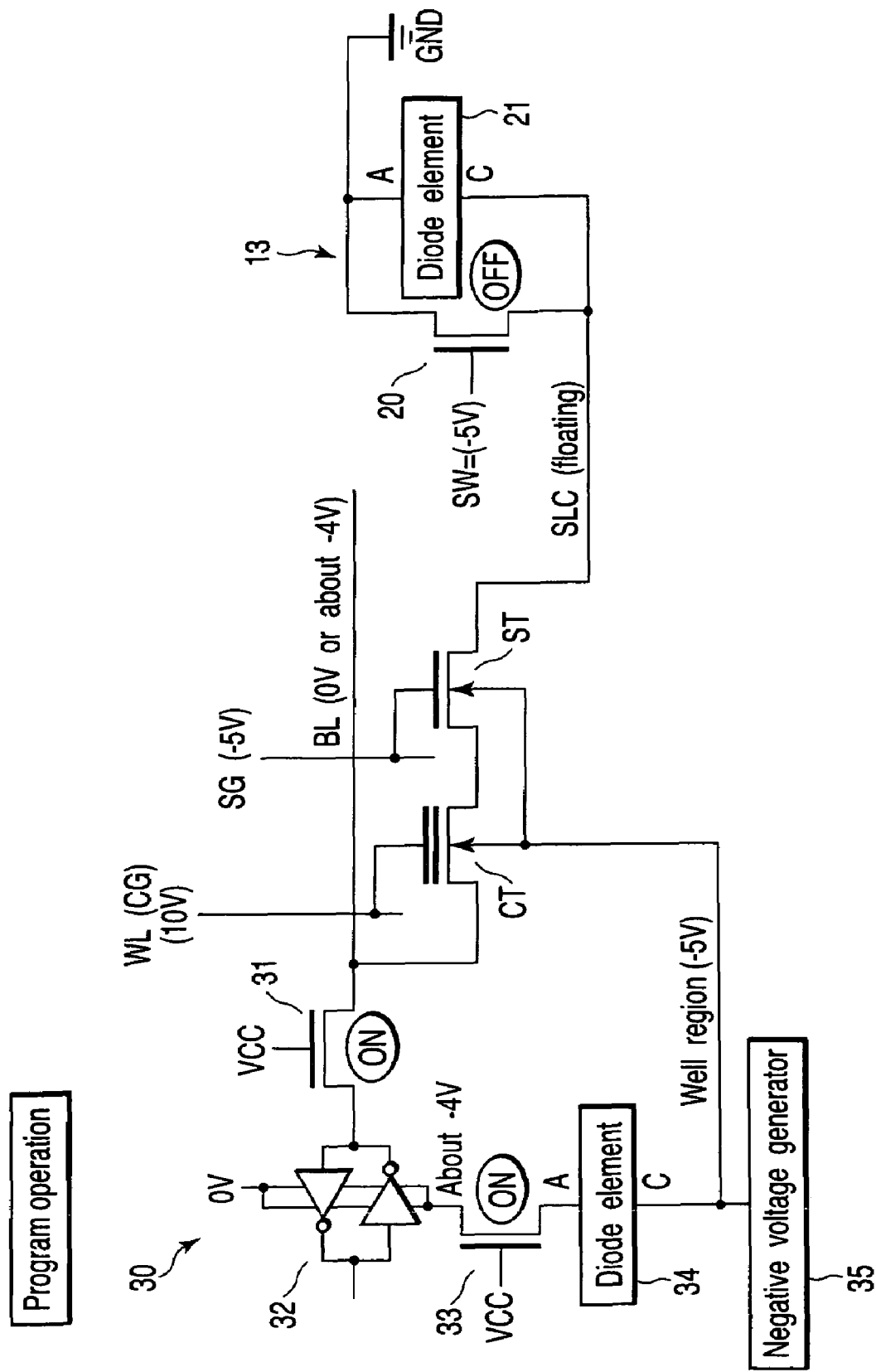
FIG. 20 is a circuit diagram which helps explain a nonvolatile semiconductor memory device according to the third embodiment and a method of writing data into the nonvolatile semiconductor memory device and which shows an example of the configuration, extracting a main part from the circuit of FIG. 19.

FIGS. 19 and 20 are circuit diagrams to help explain a nonvolatile semiconductor memory device according to a third embodiment of the present invention and a method of writing data into the nonvolatile semiconductor memory device. FIG. 19 is a block diagram showing a schematic configuration. FIG. 20 is a circuit diagram which shows an example of the configuration, extracting a main part from the circuit of FIG. 19.

As shown in FIG. 19, the third embodiment is such that, in the configuration of the second embodiment, there is further provided a bit line potential setting circuit 30 which does setting in such a manner that the potential on the bit line of a cell transistor to be written into is higher than the potential in the well region of a select gate transistor. Specifically, a data latch circuit 32 is connected via a data transfer gate 31 to a bit line BL in the memory cell array. The bit line potential setting circuit 30 supplies a voltage for setting a potential on the bit line to the data latch circuit 32. The bit line potential setting circuit 30 includes an n-channel MOSFET 33, a diode element 34, and a negative voltage generator 35.

More specifically, as shown in FIG. 20, a bit line BL is connected to the drain of the cell transistor CT. The bit line BL is connected to the source of the data transfer gate (n-channel MOSFET) 31. The drain of the data transfer gate 31 is connected to the data latch circuit 32. The p-well region in which an n-channel MOSFET is formed in the data latch circuit 32 and the source of the MOSFET are connected via the MOSFET 33 to the anode of the diode element 34. The cathode of the anode element 34 is connected to the negative voltage generator 35 functioning as a pump circuit that generates a negative voltage. The negative voltage output from the negative voltage generator 35 is supplied to the back gates (well region) of the cell transistor CT and select gate transistor ST. As long as an element or a circuit allows current to flow in the forward direction and prevents current from flowing in the reverse direction, the element or circuit with various configurations may be used as the diode element 34 in addition to, for example, the circuits shown in FIG. 14A to FIG. 14F.

In the circuit configuration, 10 V is applied to the word line WL (control gate CG) and −5 V is applied to the select gate line SG in a program operation, thereby bringing the common source line SL into the floating state, with the result that the negative voltage generator supplies a negative voltage of −5 V to the cathode of the diode element 34 and to the back gates (channel regions) of the cell transistor CT and select gate transistor ST.

As a result, when the data latch circuit 32 is in the written state, the diode element 34 raises the negative voltage by about 1 V and supplies the resulting voltage of about −4 V to the bit line BL. The rise in the voltage is not necessarily constant and differs according to the leakage current and diode characteristics of the configured cell. At this time, since −5 V is applied to the well region (p-well region) of the select gate transistor ST and the substrate bias is applied to the select gate transistor ST, the leakage current in the select gate transistor ST can be reduced.

Moreover, in the third embodiment, the source line driver 13 explained in the second embodiment performs clamping so as to prevent the potential of the common source line SLC from dropping, which causes the substrate bias to be applied more to the select gate transistor ST than in the second embodiment. Therefore, the leakage current can be reduced more, which makes it possible to reduce erroneous writing to the cell transistor CT connected to an unselected bit line.

Figure 21:
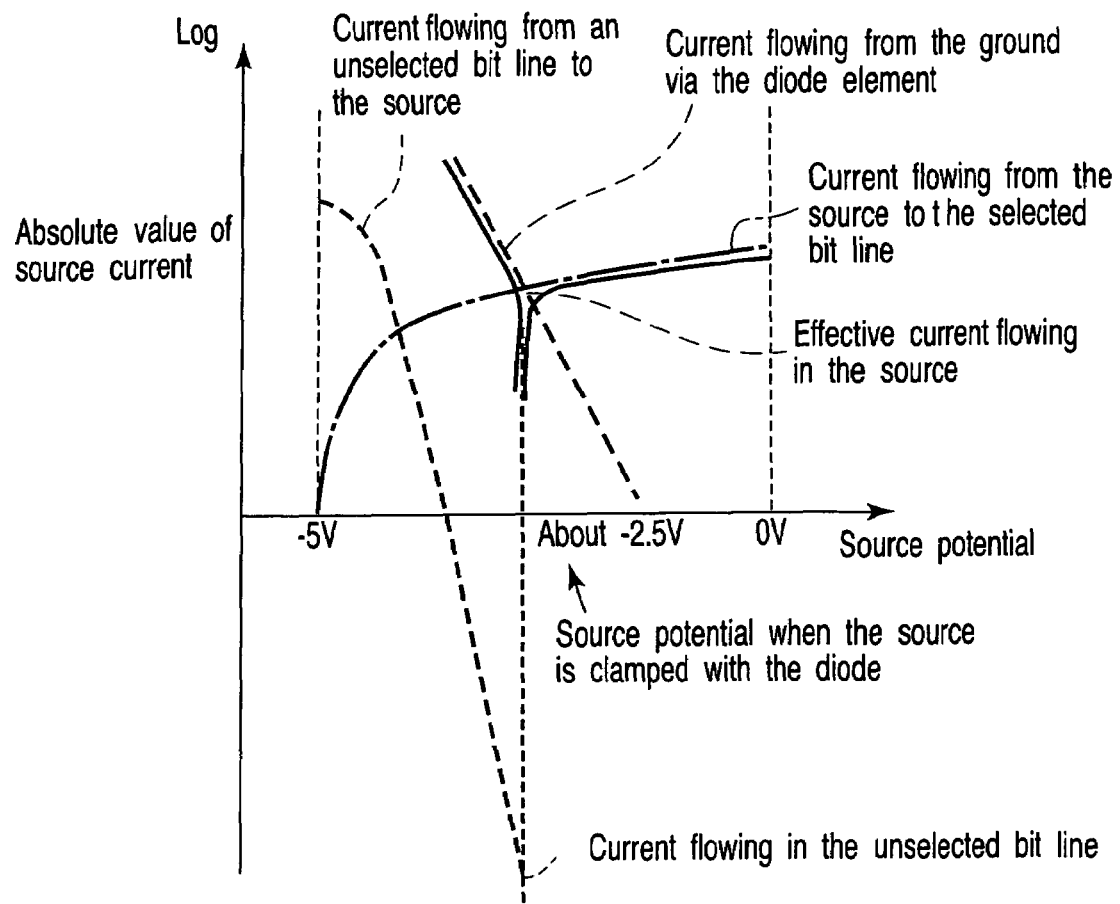
FIG. 21 is a characteristic diagram which shows the relationship between the source potential and the absolute value of the source current and which helps explain the effect of the third embodiment.

Next, using FIGS. 21 and 22, the effect of the third embodiment will be explained. FIG. 21 shows a current-voltage characteristic before the substrate bias is applied to the select gate transistor ST. When a current characteristic of the diode element is added, the potential of the common source line is at the intersection (about −2.5 V) of the current in the diode element and the current flowing from the source to the selected bit line.

At this time, since the current flowing from an unselected bit line to the source is at the intersection of −2.5 V and the current characteristic, it decreases remarkably. Therefore, hot carries generated by the leakage current decrease remarkably, which enables erroneous writing to be reduced.

On the other hand, since the leakage current flowing from the common source line SLC to the selected bit line at that time is at the intersection with the clamping current, the leakage current is larger than in the floating state. In this case, since large current flows in the negative voltage generator 35, a high negative voltage cannot be generated. Thus, the substrate bias is applied to the select gate transistor ST as in the third embodiment, which makes it possible to reduce the leakage current from the common source line SLC to the selected bit line.

Figure 22:
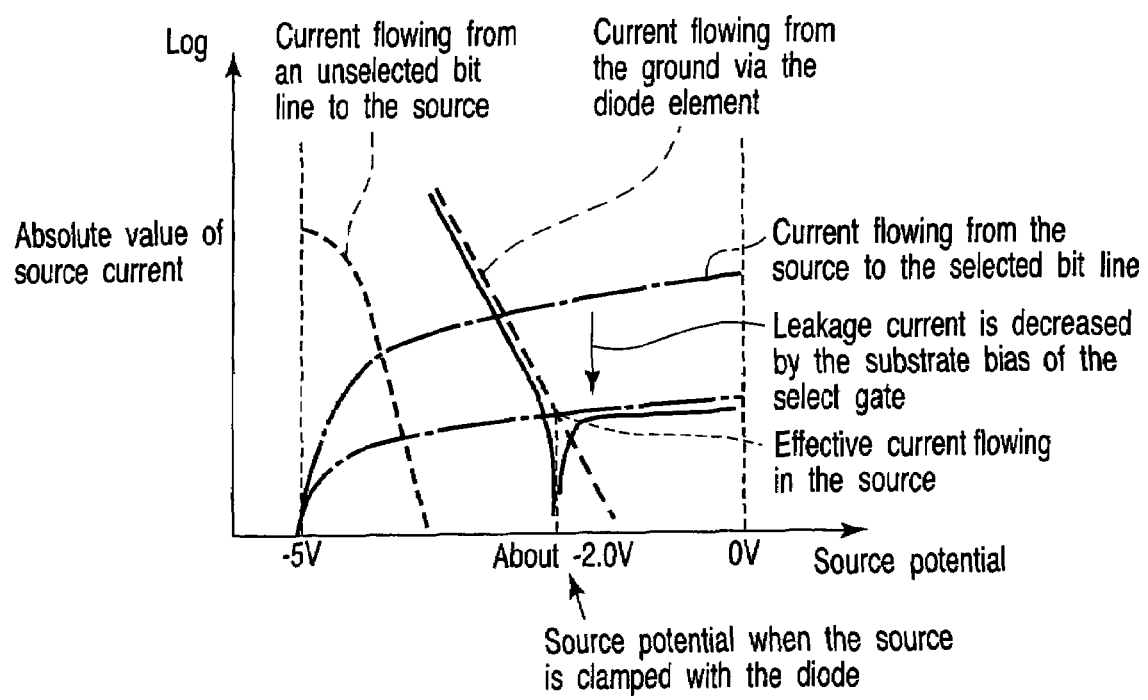
FIG. 22 is a characteristic diagram which shows the relationship between the source potential and the absolute value of the source current and which helps explain the effect of the third embodiment.

FIG. 22 is a characteristic diagram showing the relationship between the source potential and the absolute value of the source current. As seen from a comparison between FIG. 21 and FIG. 22, a relatively large leakage current from the common source line SLC to the selected bit line can be reduced. In the third embodiment, to reduce erroneous writing more, the common source line SLC is not brought into the floating state and is fixed to a specific potential by clamping the potential by the diode element 21. This reduces the leakage current from the common source line SLC to the selected bit line more than in the floating state. Therefore, it is possible to increase a margin for erroneous writing and a margin for the stabilization of the negative voltage.

Figure 23:
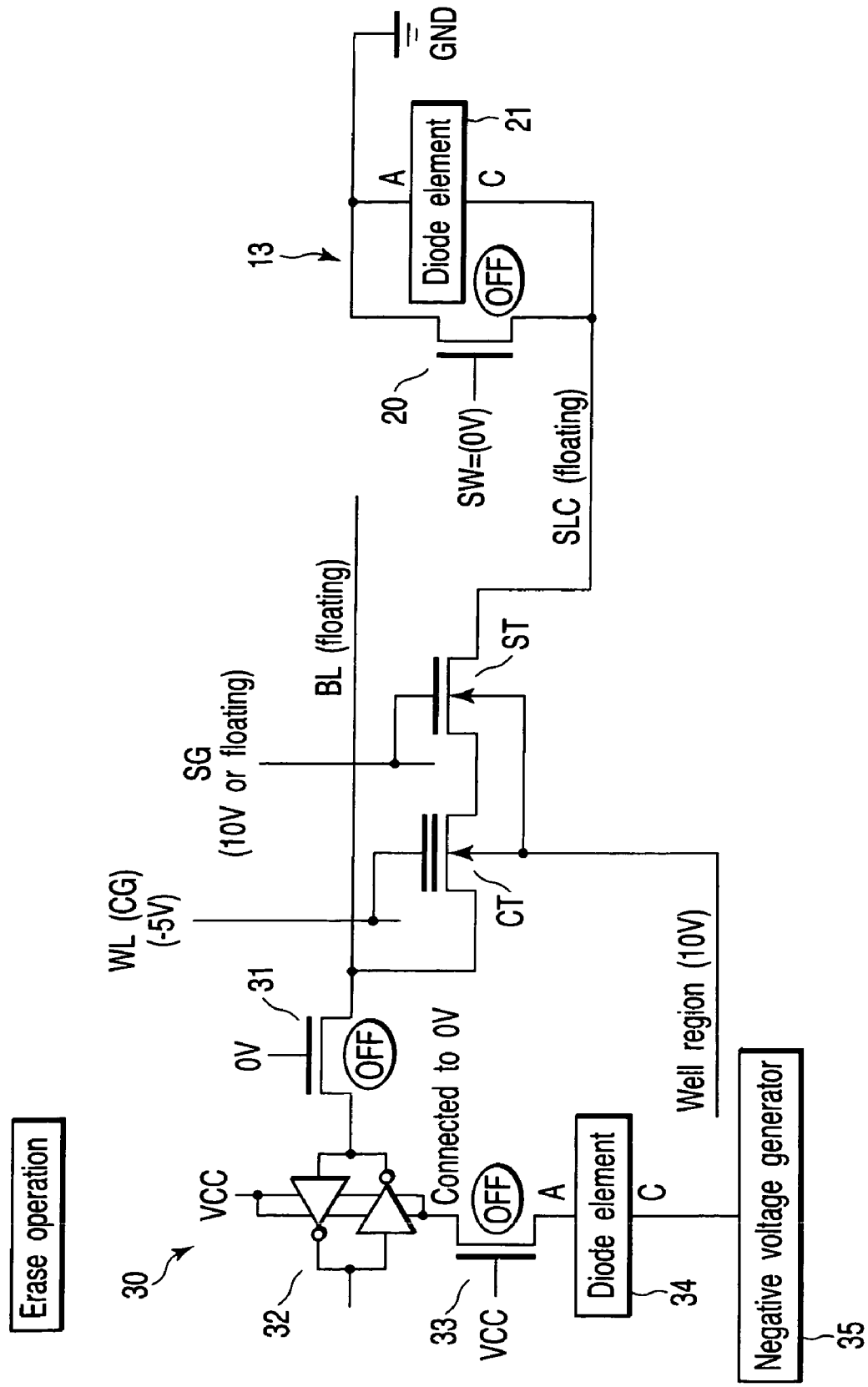
FIG. 23 is a circuit diagram to help explain an erase operation in the circuit of FIG. 20.

FIG. 23 is a circuit diagram which helps explain an erase operation in the circuit shown in FIG. 20 and which shows the relationship between potentials in an erase operation. The basic operation is the same as that of the circuit shown in FIG. 15 except for the bit line potential setting circuit 30.

[Modification 3]

FIG. 24 shows a modification of the third embodiment. In this modification, the source and well region in a p-channel MOSFET constituting the data latch circuit 32 are set to VCC (e.g., 3 V).

With this configuration, the potential of an unselected bit line can be set to "VCC−Vth" (the potential lower than the VCC level by the threshold voltage of the data transfer gate 31).

In the third embodiment, since the potential of the selected bit line is made higher than the potential 0 V of the unselected bit line because of the generated negative voltage, the potential difference between the selected bit line and the unselected bit line is decreased. In this case, however, the unselected cell is liable to be written into erroneously in a program operation. Therefore, the potential of the unselected bit line is lowered, thereby increasing the potential difference between the unselected bit line and the selected bit line. This makes it possible to reduce erroneous writing due to FN tunneling current supplied to the unselected bit line in a program operation.

[Modification 4]

Figure 25:
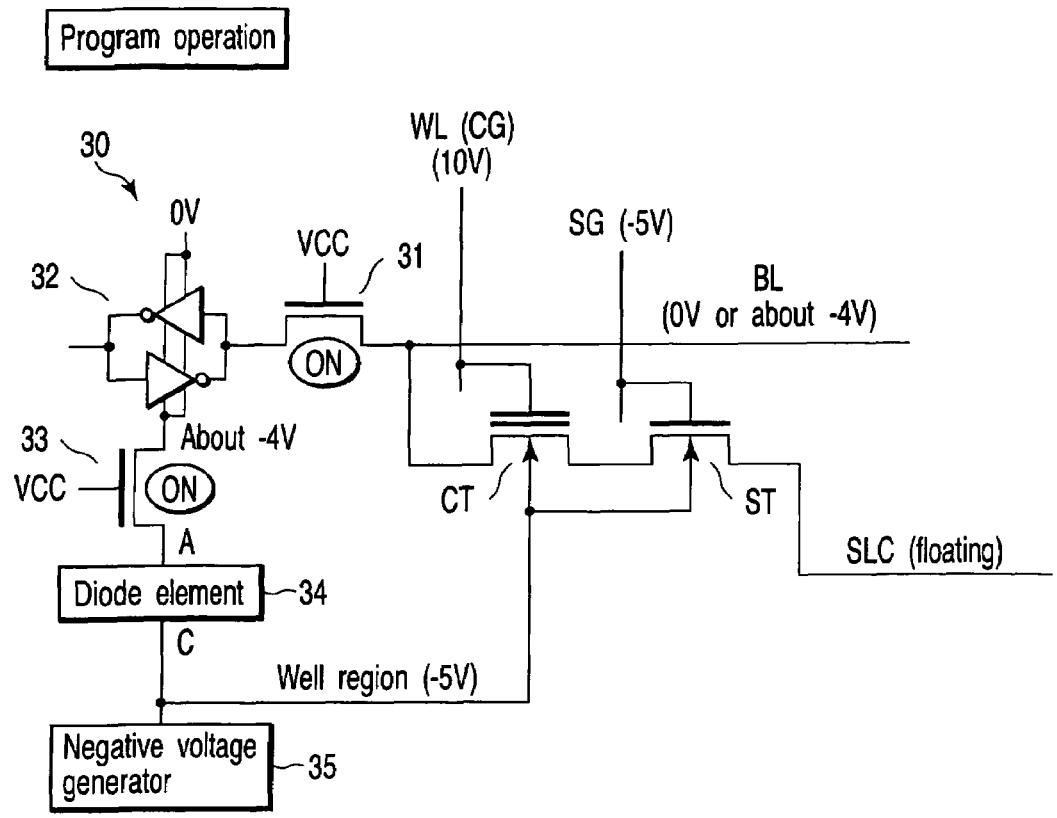
FIG. 25 is a circuit diagram to help explain another modification of the third embodiment.

As shown in FIG. 25, when only the bit line potential setting circuit 30 is provided without the source line driver 13, this produces a part of the specific effects of the present invention.

Specifically, a bit line BL is connected to the drain of a cell transistor CT. The bit line BL is connected to the source of a data transfer gate (n-channel MOSFET) 31. The drain of the data transfer gate 31 is connected to a data latch circuit 32. The p-well in which an n-channel MOSFET in the data latch circuit 32 is formed and the source of the n-channel MOSFET are connected to the anode of a diode element 34 via a MOSFET 33. The cathode of the diode element 34 is connected to a negative voltage generator 35 acting as a pump circuit which generates a negative voltage. The negative voltage output from the negative voltage generator 35 is supplied to the cathode of the diode 34 and the back gates (well region) of the cell transistor CT and select gate transistor ST.

With this circuit configuration, in a program operation, 10 V is applied to the word line WL (control gate CG), −5 V is applied to the select gate line SG, the common source line SL is brought into the floating state, and the negative generator outputs a negative voltage of −5 V and supplies the negative voltage to the cathode of the diode 34 and to the back gates (well region) of the cell transistor CT and select gate transistor ST.

As a result, when the data latch circuit 34 is in the written state, about −4 V (the voltage raised by, for example, 1 V from the negative voltage at the diode element 34) is applied to the bit line BL. At this time, −5 V is applied to the p-well region of the select gate transistor ST and the substrate bias is applied to the select gate transistor ST, which enables the leakage current in the select gate transistor to be reduced.

Figure 26:
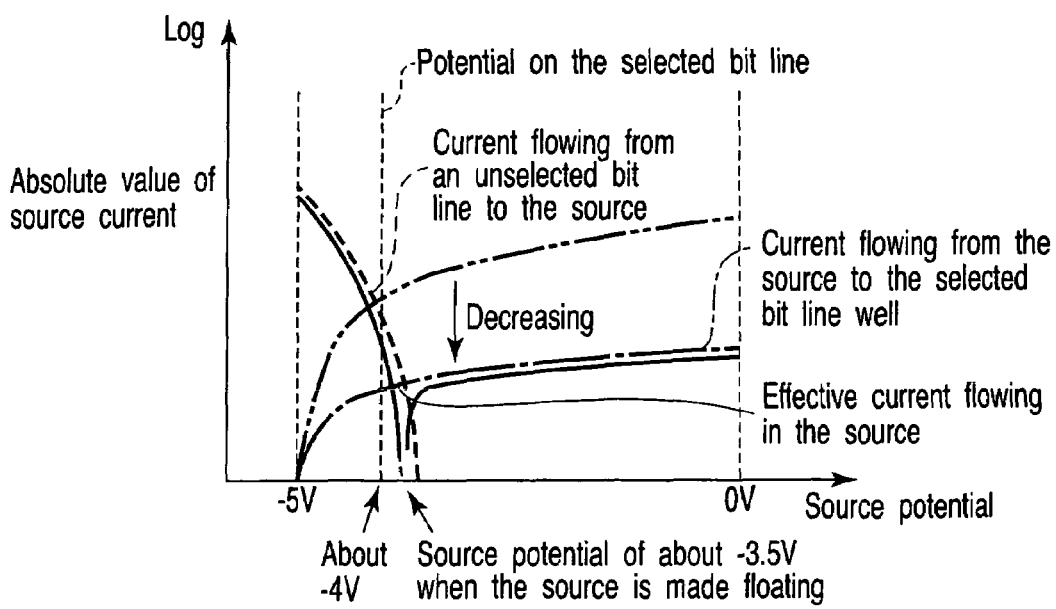
FIG. 26 is a characteristic diagram showing a current-voltage characteristic viewed from the source.

FIG. 26 shows a current-voltage characteristic viewed from the source. This characteristic shows a case where the source of a cell transistor connected to the selected bit line is connected to the source of a cell transistor connected to an unselected bit line. The application of the substrate bias causes the current flowing from the common source line SLC to the selected bit line BL to decrease, with the result that the intersection of the current flowing from the unselected bit line to the common source line and the current flowing from the common source line to the selected bit line rises from the voltage of FIG. 6 to about −3.5 V. The current value at the intersection is smaller than the value of FIG. 6 by one decimal place or more, with the result that the leakage current supplied from the negative voltage generator via the unselected bit line and the common source line to the selected bit line decreases. This reduces the load current supplied to the negative voltage generator, stabilizing the voltage of the negative voltage generator, which prevents the output voltage from fluctuating according to the load current. In addition, a lower negative voltage can be generated. Moreover, since the leakage current flowing from the unselected bit line to the common source line also decreases, the occurrence of hot carriers in the cell transistor connected to the unselected bit line also decreases, which enables erroneous writing from being suppressed.

Figure 27:
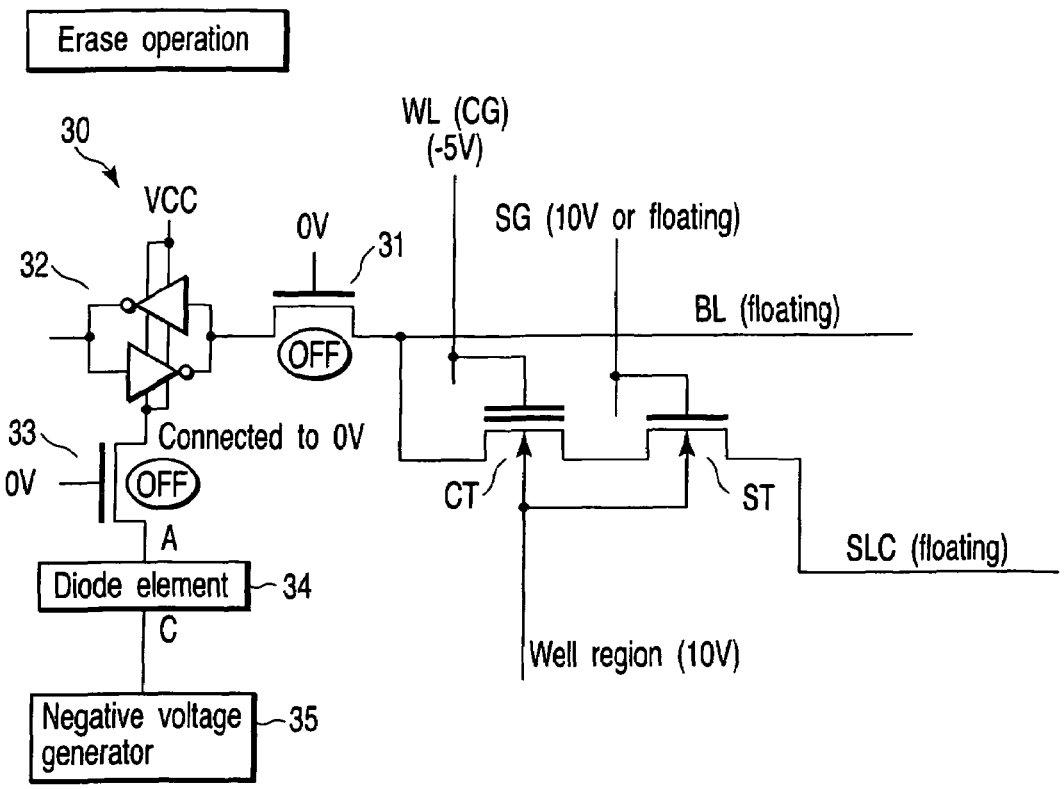
FIG. 27 is a circuit diagram showing the relationship between potentials in an erase operation in the circuit of FIG. 25.

FIG. 27 shows the relationship between potentials in an erase operation in the circuit of FIG. 25. In an erase operation, 10 V is applied to the well region, −5 V is applied to the word line WL (control gate CG), the selected gate line is set to 10 V or in the floating state, the common source line SLC is set in the floating state, and 0 V is applied to the data transfer gate, thereby turning off the data transfer gate. In the data latch circuit 32, the back gate (well region) and source of the n-channel MOSFET are connected to 0 V. The back gate (well region) and source of the p-channel MOSFET are connected to VCC (e.g., 3 V). At this time, the MOSFET 33 is turned off, preventing the potential of the negative voltage generator 35 from being supplied to the data latch circuit 32.

Figure 28:
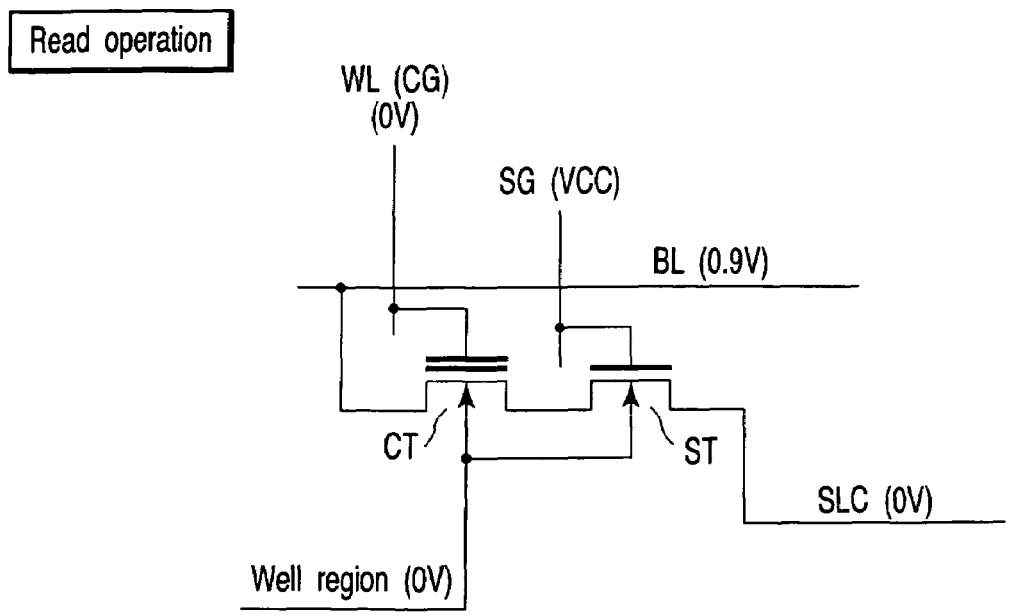
FIG. 28 is a circuit diagram showing the relationship between potentials in a read operation in the circuit of FIG. 25.

FIG. 28 shows the relationship between potentials in a read operation. In FIG. 28, 0 V is applied to the word line WL (control gate CG), VCC (e.g., 3 V) is applied to the select gate line SG, 0 V is applied to the common source line, 0 V is applied to the well region, and the bit line BL is precharged to about 0.9 V. Whether data is "1" or "0" is determined, depending on whether the sense amplifier (not shown) connected to the bit line BL detects whether or not the potential of the bit line drops.

As described above, in the third embodiment, the potential of the bit line of the cell transistor to be written into is made higher than the potential of the well region of the select gate transistor. To realize the relationship between potentials, the diode element 34 raises the potential of the well by the forward voltage and supplies the raised potential to the bit line instead of generating a voltage in the well region and a different voltage on the bit line. This enables the substrate bias to be applied to the select gate transistor ST, which makes it possible to suppress the off leakage current in the select gate transistor ST. Moreover, since the load current in the negative-voltage power supply circuit can be reduced, the substrate bias can be applied without increasing the number of power supply circuits.

Figure 29:
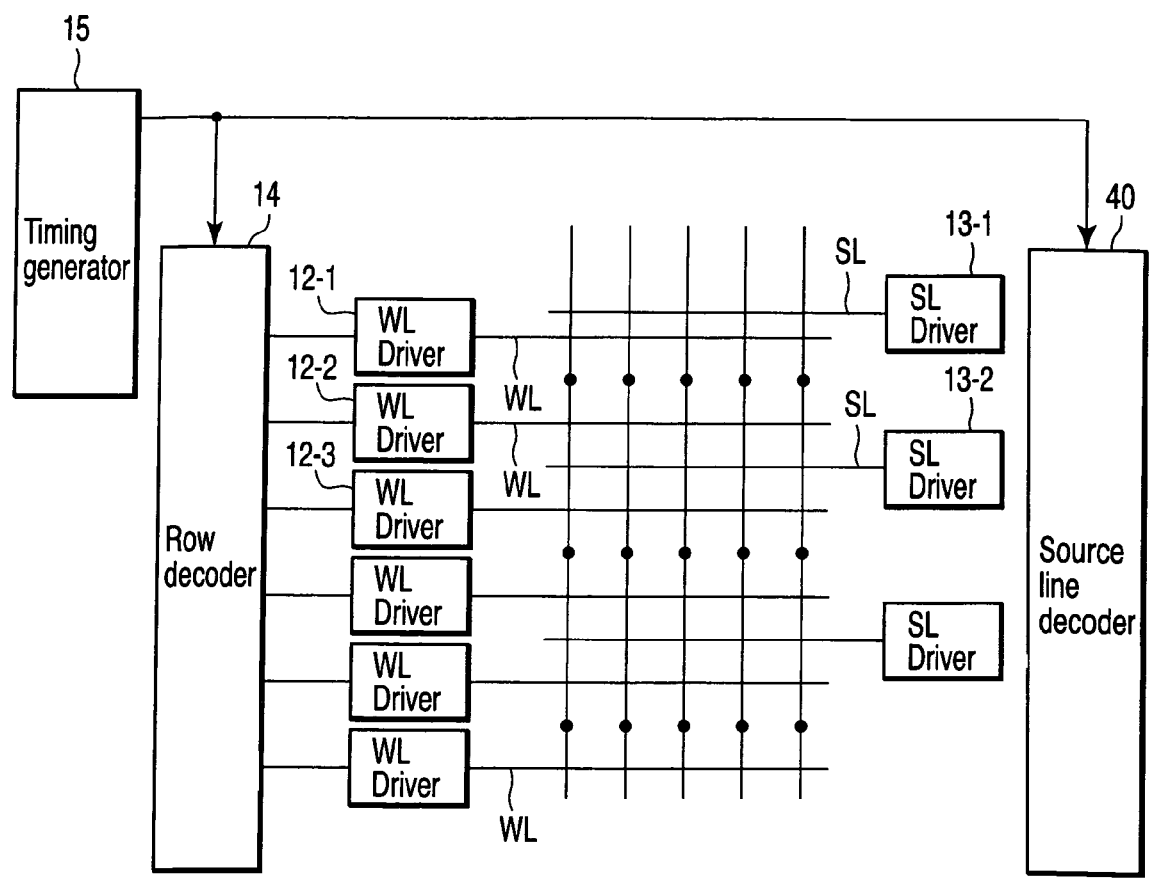
FIG. 29 is a block diagram which helps explain a nonvolatile semiconductor memory device according to a fourth embodiment of the present invention and a method of writing data into the nonvolatile semiconductor memory device and which shows a schematic configuration.
Figure 30:
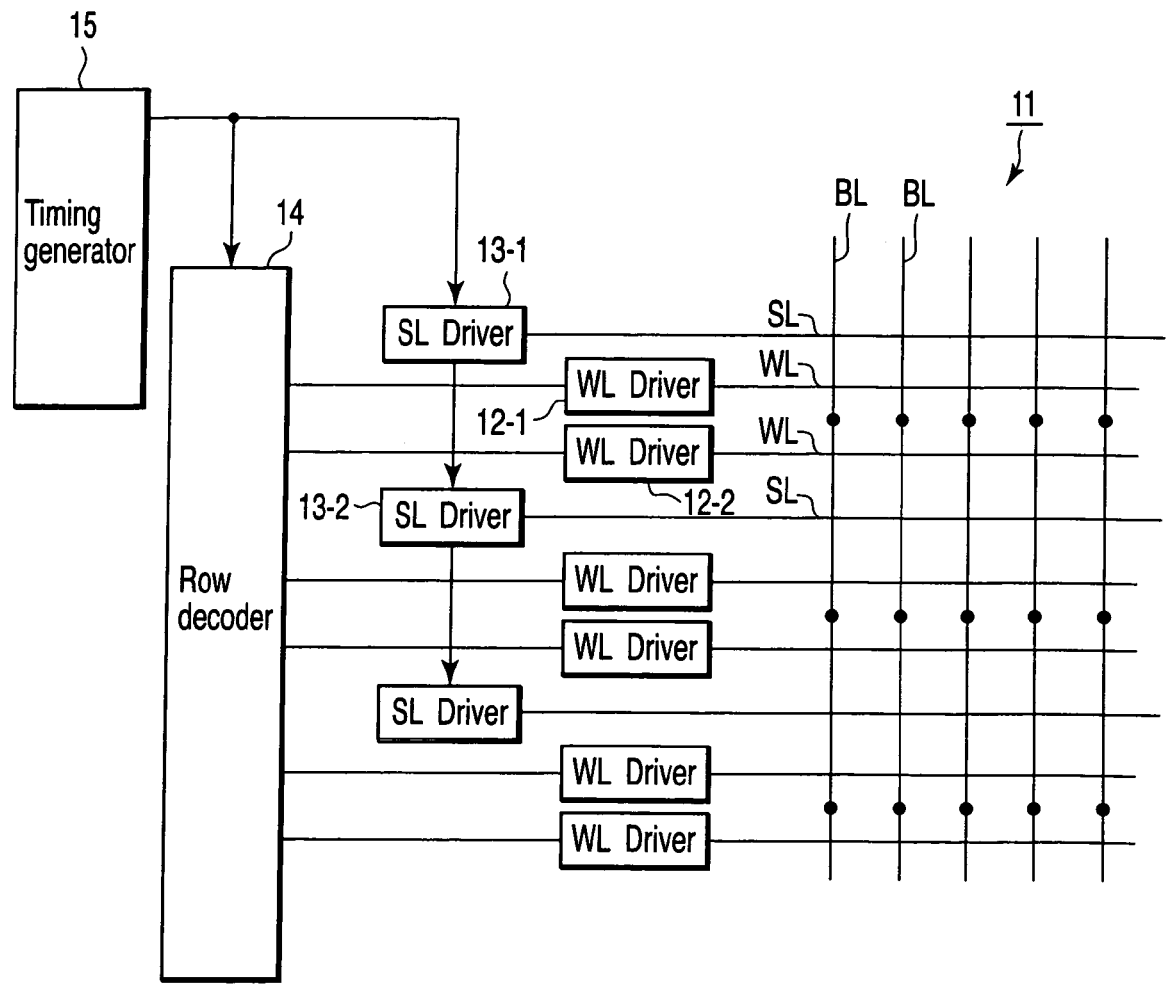
FIG. 30 is a circuit diagram showing a modification of the circuit shown in FIG. 29.

At this time, the potential of the bit line connected to the cell transistor to be written into is higher than that of the well region, resulting in a decrease in the absolute value of the negative voltage. Consequently, a margin for disturbance caused in a write operation decreases. To overcome this problem, the potential of the bit line of the cell transistor not to be written into is set to a potential higher than the ground level Fourth Embodiment FIG. 29 is a block diagram which helps explain a nonvolatile semiconductor memory device according to a fourth embodiment of the present invention and a method of writing data into the nonvolatile semiconductor memory device and which shows a schematic configuration of the nonvolatile semiconductor memory device.

In the first to third embodiments, all of the memory cells in the memory cell array have been connected to the common source line SLC. Since the memory cell connected to the selected word line differs from the memory cell connected to an unselected word line in the potential at each terminal, the optimum source line potential actually differs in a write operation.

To overcome this problem, in the fourth embodiment, there are provided a source line decoder 40 and source line drivers 13-1, 13-2, . . . which are controlled by the output signal from the source line driver 40 and drive the source lines SL on a word line WL basis. The timing generator 15 inputs a timing signal to the source line decoder 40 and controls the decoder 40, thereby driving the source lines SL on a word line WL basis.

With this configuration, the source lines SL can be decoded on a word line WL basis, enabling different potentials to be applied, which makes it possible to supply optimum source line potentials to the selected word line and unselected word line separately. Therefore, the degree of freedom of the source line potential can be increased, which makes it possible to selectively set the selected word line and unselected word line to the optimum potentials.

[Modification 5]

The circuit shown in FIG. 29 can be modified into a circuit in which the part related to decoding are shared by the word lines WL and source lines SL and the timing generator 15 inputs information about timing directly to the source line drivers 13-1, 13-2, . . . . In this circuit, the necessary circuit occupies a smaller area of the configuration.

Fifth Embodiment

Each of the first to fourth embodiments can be applied to various arrays configured on a block basis, on a sizable memory cell array basis, on an erase unit basis, or on a memory cell array basis. A common source line is provided for each of these units and a source line driver is provided for each of the common source lines.

Figure 31:
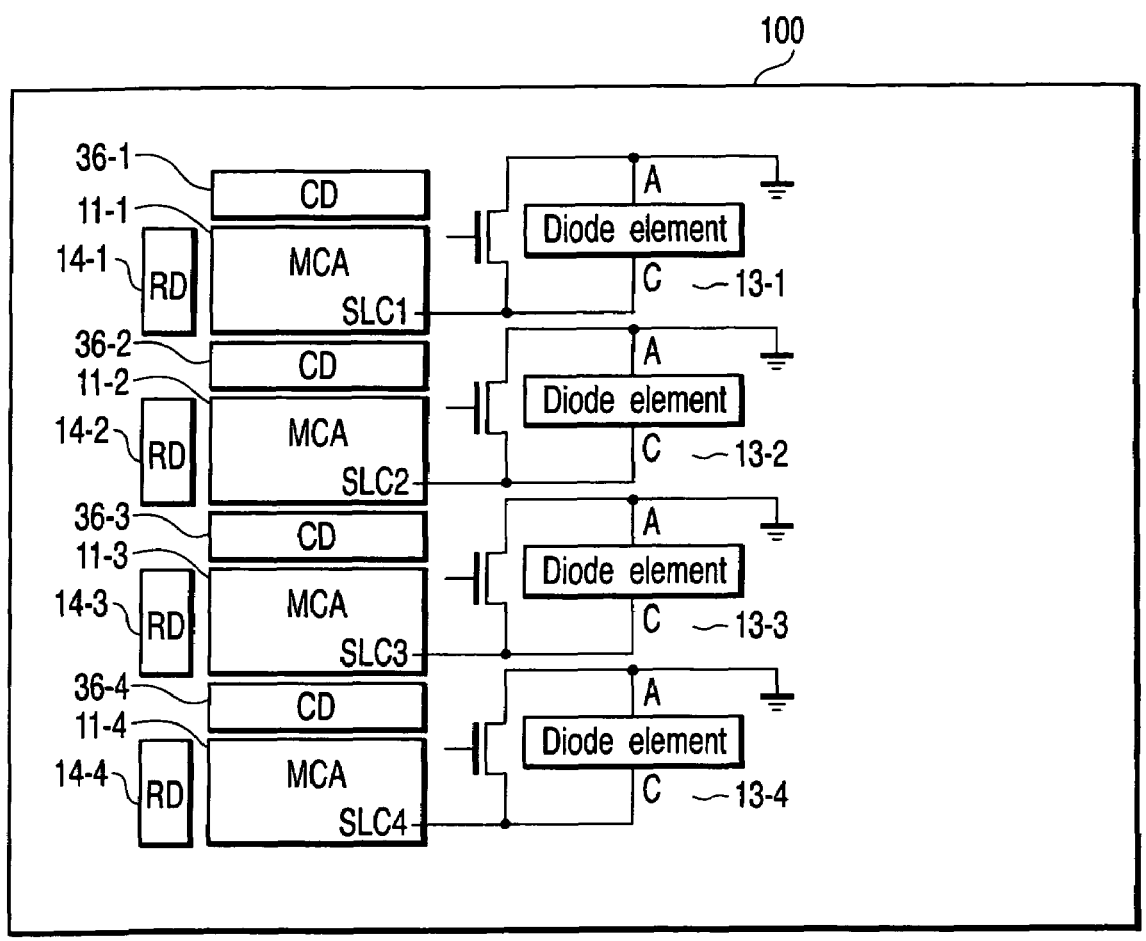
FIG. 31 is a block diagram which helps explain a nonvolatile semiconductor memory device according to a fifth embodiment of the present invention and a method of writing data into the nonvolatile semiconductor memory device and which shows a schematic configuration.

FIG. 31 schematically shows a case where the second embodiment is applied to a configuration where a plurality of (e.g., four) memory cell arrays are formed in a single chip. Specifically, a single semiconductor chip 100 includes memory cell arrays (MCA) 11-1 to 11-4, row decoders (RD) 14-1 to 14-4, column decoders (CD) 36-1 to 36-4, and source line drivers 13-1 to 13-4 connected to common source lines SL1 to SL4 in the respective memory cell arrays 11-1 to 11-4.

In this case, although the current setting of the diode element has to be done, taking into account the sum total of leakage currents in the cells sharing the diode, the basis idea is the same as described above.

Figure 32:
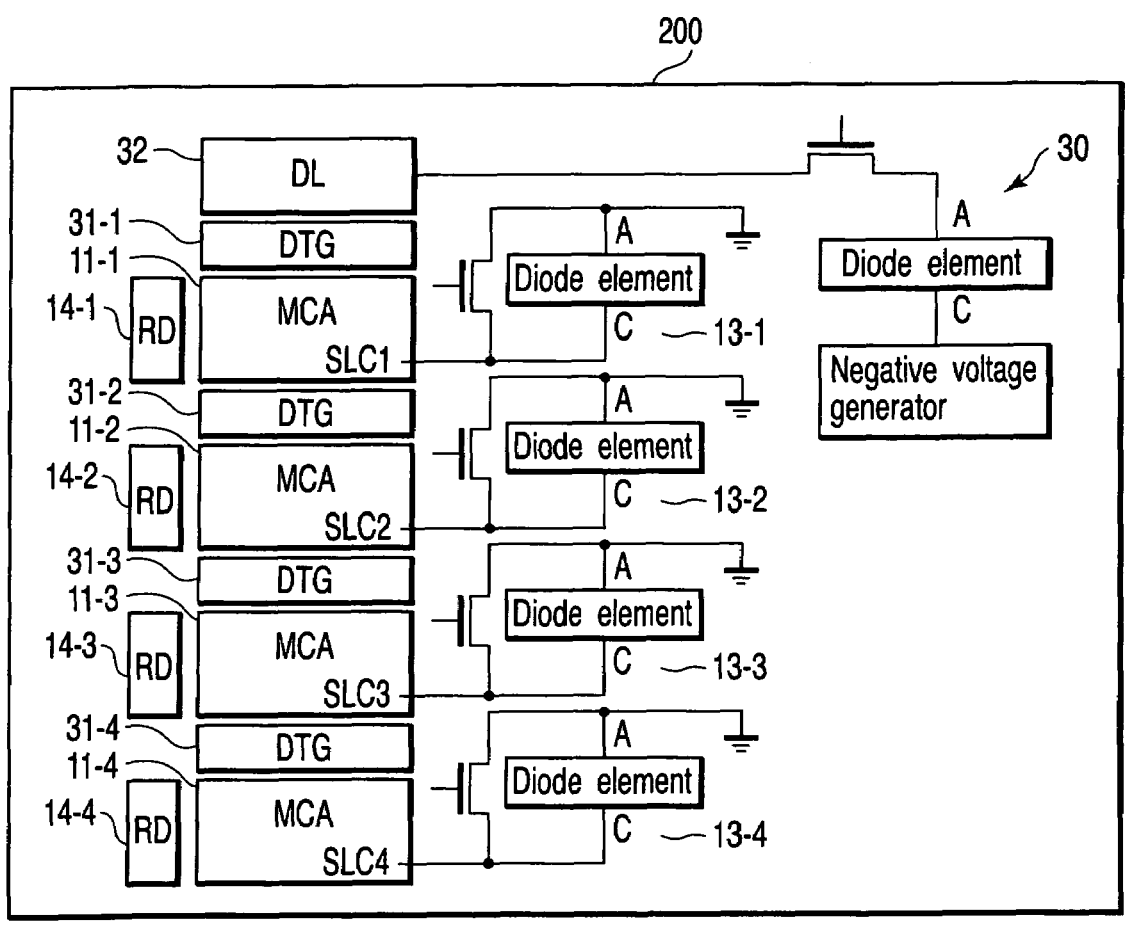
FIG. 32 is a block diagram showing a schematic configuration to help explain a modification of the fifth embodiment.

FIG. 32 schematically shows a case where the third embodiment is applied. Specifically, a single semiconductor chip 200 includes memory cell arrays (MCA) 11-1 to 11-4, row decoders (RD) 14-1 to 14-4, data transfer gates (DTG) 31-1 to 31-4, a data latch circuit (DL) 32, source line drivers 13-1 to 13-4 connected to common source lines SL1 to SL4 in the respective memory cell arrays 11-1 to 11-4, and a bit line potential setting circuit 30.

Similarly, the other embodiments and modification can be applied.

With this configuration, the optimum source line potential can be selected on a block basis, on a sizable memory cell array basis, on an erase unit basis, or a memory cell array basis, which enables the degree of freedom of selection to be increased.

While in the above-described embodiments and modifications, the specific potentials have been used, they are illustrative and not restrictive. It goes without saying that the optimum potential should be selected according to the characteristics of the cell transistors or select gate transistors. For instance, when lowering a negative voltage to be applied causes a margin for erroneous writing into unselected cells in a program operation to increase, resulting in an increase in the leakage current, the effect of the present invention becomes more significant.

In addition, the memory cell structure can be applied to another cell structure where a cell transistor has its drain connected to a bit line and its source connected to a source line and a change in the resistance between the bit line and source line is detected and read, such as a NAND memory or a 3Tr-NAND memory.

Furthermore, while in the first to fifth embodiments, a nonvolatile semiconductor memory device has been used, it goes without saying that the present invention can be applied to a semiconductor device where a nonvolatile semiconductor memory device and a logic integrated circuit are mounted on a single chip or in an SoC (system-on-chip) semiconductor device.

As described above, according to an aspect of this invention, there is provided a nonvolatile semiconductor memory device capable of widening a margin for memory cell characteristics and suppressing erroneous operations and a decrease in the operating speed and a method of writing data into the nonvolatile semiconductor memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a floating gate cell transistor which stores data by accumulating charge in a floating gate;
a select gate transistor whose drain is connected to the source of the cell transistor and whose source is connected to a source line; and
a source line driver which is configured so as to drive the source line in a write operation at a potential between a substrate bias potential of the cell transistor and select gate transistor and the ground potential.

2. The semiconductor device according to claim 1, wherein the source line driver includes a MOSFET whose current path is connected between the source line and the ground point and a driver circuit which drives the MOSFET on the basis of a timing signal representing a write operation.

3. The semiconductor device according to claim 2, wherein the MOSFET is of the p-channel type and has its back gate connected to the ground point.

4. The semiconductor device according to claim 2, wherein the MOSFET is of the n-channel type and has its back gate connected to the back gate of the cell transistor and that of the select gate transistor.

5. The semiconductor device according to claim 1, wherein the source line driver includes a first MOSFET whose current path is connected between the source line and the ground point and a first diode element which has its anode connected to the ground point and its cathode connected to the source line.

6. The semiconductor device according to claim 5, wherein the first diode element includes any one of a p-n junction diode, a series connection circuit of a p-n junction diode and a resistance, a series connection circuit of a plurality of p-n junction diodes, a diode-connection MOSFET, a series connection circuit of a diode-connection MOSFET and a resistance, and a series connection circuit of a plurality of diode-connection MOSFETs.

7. The semiconductor device according to claim 5, further comprising:
a bit line connected to the cell transistor;
a data transfer gate one end of which is connected to the bit line;
a data latch circuit connected to the other end of the data transfer gate;
a second MOSFET one end of whose current path is connected to the data latch circuit;
a second diode element whose anode is connected to the other end of the current path of the second MOSFET; and
a negative voltage generator which applies a negative voltage to the cathode of the second diode element.

8. The semiconductor device according to claim 7, wherein the second diode element includes any one of a p-n junction diode, a series connection circuit of a p-n junction diode and a resistance, a series connection circuit of a plurality of p-n junction diodes, a diode-connection MOSFET, a series connection circuit of a diode-connection MOSFET and a resistance, and a series connection circuit of a plurality of diode-connection MOSFETs.

9. The semiconductor device according to claim 1, further comprising:
a bit line connected to the drain of the cell transistor; and
a word line which is provided so as to cross the bit line and which is connected to the control gate of the cell transistor,
wherein the source line is provided in parallel with the word line.

10. The semiconductor device according to claim 1, wherein the cell transistor is written into and erased using Fowler-Nordheim tunneling current.

11. A semiconductor device comprising:
a memory cell array where memory cells are arranged in a matrix, each of the memory cells including a floating gate cell transistor that stores data by accumulating charge in the floating gate and a select gate transistor whose drain is connected to the source of the cell transistor;
bit lines which are provided for columns of memory cells in the memory cell array in a one-to-one correspondence and which are connected to the drains of the cell transistors on a column basis;
word lines which are provided for rows of memory cells in the memory cell array in a one-to-one correspondence and which are connected to the control gates of the cell transistors on a row basis;
source lines which are provided in parallel with the word lines in a one-to-one correspondence and which are connected to the sources of the select gate transistors; and
a source line driver which is configured to drive the source lines in a write operation at a potential between the substrate bias potential of the cell transistors and the select gate transistors and the ground potential.

12. The semiconductor device according to claim 11, further comprising:
data transfer gates which are connected to the bit lines in a one-to-one correspondence;
data latch circuits which are connected to the data transfer gates in a one-to-one correspondence; and
bit line potential setting circuits which supply to the data latch circuits a voltage for setting a potential on each of the bit lines.

13. The semiconductor device according to claim 12, further comprising:
word line drivers which drive the corresponding ones of the word lines; and
a row decoder which supplies a decode signal to the word line drivers.

14. The semiconductor device according to claim 13, further comprising:
a timing generator which controls the operation timing of the source line driver and the row decoder.

15. The semiconductor device according to claim 11, further comprising:
a common source line connected equally to the source lines,
wherein the source lines are provided for rows of memory cells in the memory cell array in a one-to-one correspondence and the source line driver drives each of the source lines via the common source line.

16. The semiconductor device according to claim 11, wherein the source lines are provided for rows of memory cells in the memory cell array in a one-to-one correspondence and are connected to the sources of the select gate transistors on a row basis and the source line driver selectively drives each of the source lines.

17. The semiconductor device according to claim 12, wherein the source line driver includes a first MOSFTE whose current path is connected between the source line and the ground point and a driver circuit which drives the first MOSFET on the basis of a timing signal representing a write operation, and the bit line potential setting circuit includes a second MOSFET one end of whose current path is connected to the data latch circuit, a second diode element whose anode is connected to the other end of the current path of the second MOSFET, and a negative voltage generator which applies a negative voltage to the cathode of the second diode element.

18. A method of writing data into a semiconductor device which includes a floating gate cell transistor that stores data by accumulating charge in a floating gate, a select gate transistor whose drain is connected to the source of the cell transistor and whose source is connected to a source line, and a source line driver which drives the source line, the method comprising:

setting the source line to the ground potential;

changing the well region of the cell transistor and the select gate transistor from the ground potential to a negative potential; and disconnecting the source line from the ground potential in the middle of lowering the potential in the well region to a negative potential and lowering the source line potential to the negative potential through coupling with the well region.

19. The method of writing data into the semiconductor device according to claim 18, wherein the time with which the source line is disconnected from the ground potential is the timing with which the potential in the well region changes from the normal state to a writing state.

* * * * *